(12) United States Patent
Fang et al.

(10) Patent No.: US 11,024,569 B2
(45) Date of Patent: Jun. 1, 2021

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCOR ENGINEERING, INC., Kaohsiung (TW)

( * ) Notice: Subject to any disclaimer, the term of this patent is extended or adjusted under 35 U.S.C. 154(b) by 248 days.

(21) Appl. No.: 15/673,239

(22) Filed: Aug. 9, 2017

(65) Prior Publication Data

US 2019/0051590 A1   Feb. 14, 2019

(51) Int. Cl.
  *H01L 23/498*  (2006.01)
  *H01L 25/065*  (2006.01)
  (Continued)

(52) U.S. Cl.
  CPC .... *H01L 23/49827* (2013.01); *H01L 21/6835* (2013.01); *H01L 23/31* (2013.01); *H01L 23/49811* (2013.01); *H01L 24/32* (2013.01); *H01L 24/82* (2013.01); *H01L 24/83* (2013.01); *H01L 25/0657* (2013.01); *H01L 25/50* (2013.01); *H01L 21/568* (2013.01); *H01L 23/3128* (2013.01); *H01L 2221/68345* (2013.01); *H01L 2221/68359* (2013.01); *H01L 2224/16145* (2013.01); *H01L 2224/18* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73204* (2013.01); *H01L 2224/73207* (2013.01); *H01L 2224/73265* (2013.01); *H01L 2224/78301* (2013.01); *H01L 2224/83385* (2013.01);
  (Continued)

(58) Field of Classification Search
  CPC . H01L 2224/32225; H01L 2224/73204; H01L 2924/01019; H01L 2924/10253; H01L 2924/00; H01L 2924/01015; H01L 2924/01047; H01L 23/49827; H01L 25/0657; H01L 2224/16145; H01L 2224/08112–08113; H01L 2224/08147
  See application file for complete search history.

(56) References Cited

U.S. PATENT DOCUMENTS 5,830,800 A * 11/1998 Lin ................ H01L 21/561
                                                438/459
7,777,351 B1   8/2010 Berry et al.
(Continued)

*Primary Examiner* — Amar Movva
(74) *Attorney, Agent, or Firm* — Foley & Lardner LLP

(57) ABSTRACT

A semiconductor package device includes a circuit layer having a top surface, a first electronic component disposed on the top surface of the circuit layer, and a first conductive element disposed on the top surface of the circuit layer, the first conductive element having a top surface. The first electronic component has an active surface and a back surface facing the top surface of the circuit layer. A distance between the active surface of the first electronic component and the top surface of the circuit layer is greater than a distance between the top surface of the first conductive element and the top surface of the circuit layer.

10 Claims, 25 Drawing Sheets

(51) Int. Cl.
    *H01L 23/31*         (2006.01)
    *H01L 25/00*         (2006.01)
    *H01L 23/00*         (2006.01)
    *H01L 21/683*       (2006.01)
    *H01L 21/56*         (2006.01)

(52) U.S. Cl.
    CPC ............... *H01L 2224/85181* (2013.01); *H01L 2224/92247* (2013.01); *H01L 2924/00014* (2013.01); *H01L 2924/1304* (2013.01); *H01L 2924/14* (2013.01); *H01L 2924/1532* (2013.01); *H01L 2924/181* (2013.01); *H01L 2924/18162* (2013.01)

(56) References Cited

U.S. PATENT DOCUMENTS

| | | | |
|---|---|---|---|
| 8,378,383 B2 | 2/2013 | Pagaila et al. | |
| 8,669,140 B1* | 3/2014 | Muniandy | H01L 25/105 438/109 |
| 8,980,691 B2* | 3/2015 | Lin | H01L 25/50 257/686 |
| 9,997,469 B2* | 6/2018 | Jian | H01L 25/50 |
| 10,002,852 B1* | 6/2018 | Hu | H01L 25/0657 |
| 10,083,912 B2* | 9/2018 | Gong | H01L 23/5389 |
| 2008/0150161 A1* | 6/2008 | Lin | H01L 24/10 257/778 |
| 2011/0068453 A1* | 3/2011 | Cho | H01L 21/565 257/686 |

* cited by examiner

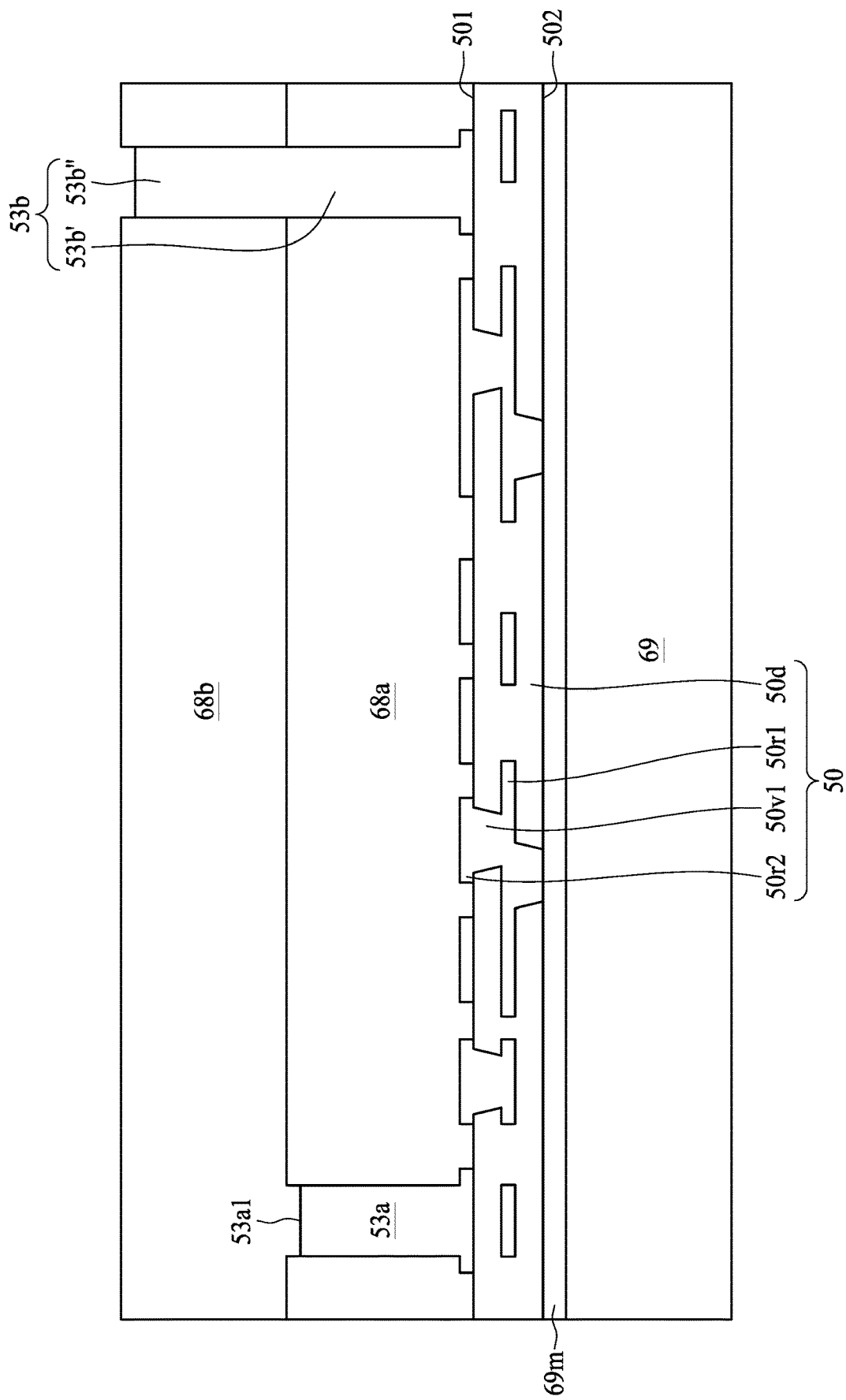

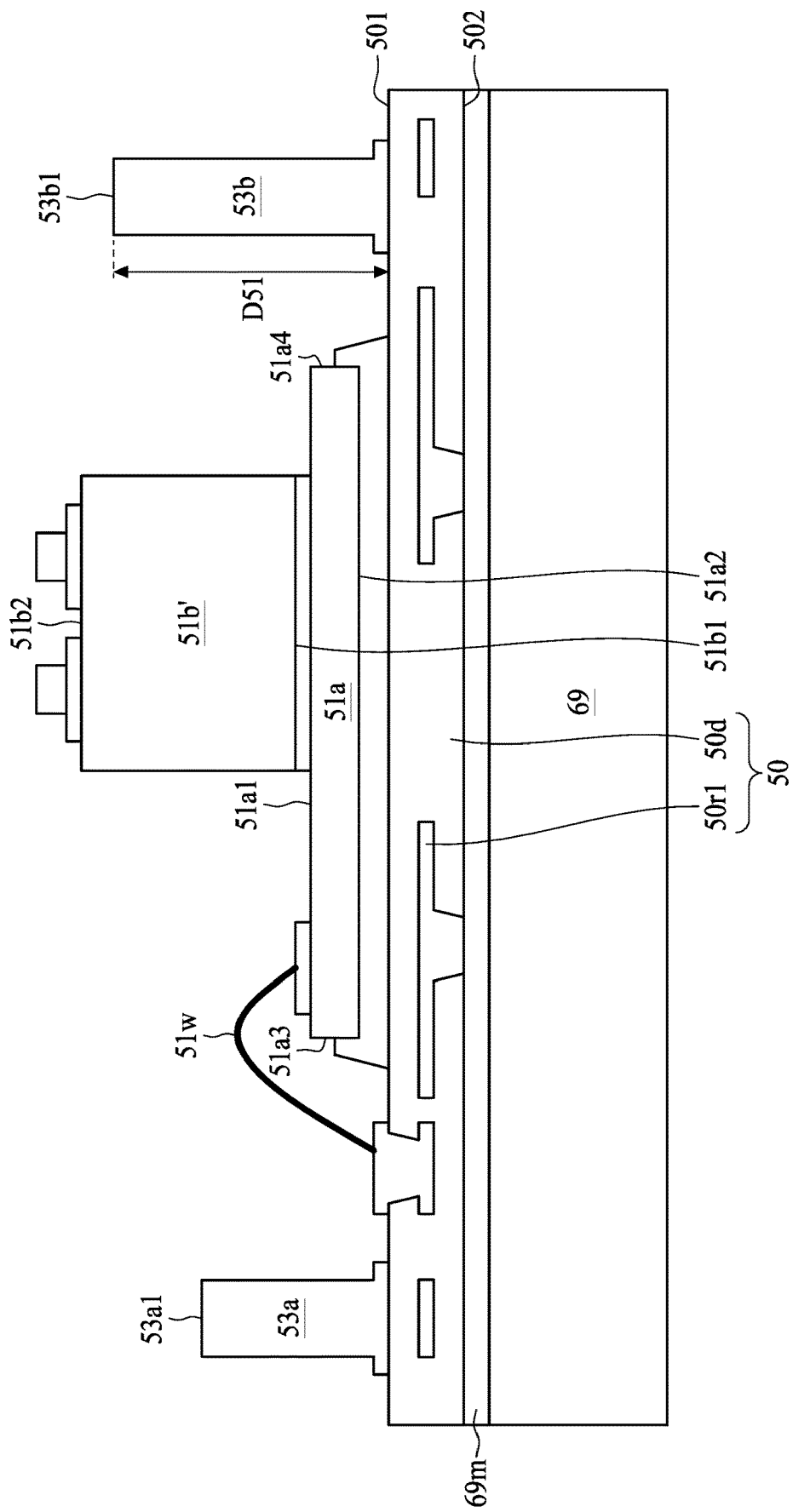

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same, and to a semiconductor package device including a stacking structure and a method of manufacturing the same.

2. Description of the Related Art

A semiconductor package device may include multiple chips to increase its performance and functionality. The multiple chips might be vertically stacked to reduce a horizontal footprint of the semiconductor package device. In this configuration, a first surface of a top chip may be attached to a first surface of a bottom chip while a second active surface of the top chip is exposed. To move the stacked chips in a subsequent manufacturing process, a nozzle with a relatively wide opening can be used to avoid damage to the circuit structure on the exposed active surface of the top chip (note that an exposed circuit structure may be adjacent to a center of the active surface of the top chip). The relatively wide opening of the nozzle may occupy relatively great space in the package. For example, the distance between each of a number of conductive elements (which may surround the stacked chips) and the stacked chips can be made large to avoid a collision with the nozzle while picking or placing the stacked chips, which can hinder miniaturization of the semiconductor package device.

SUMMARY

In one or more embodiments, according to one aspect, a semiconductor package device includes a circuit layer having a top surface, a first electronic component disposed on the top surface of the circuit layer, and a first conductive element disposed on the top surface of the circuit layer, the first conductive element having a top surface. The first electronic component has an active surface and a back surface facing the top surface of the circuit layer. A distance between the active surface of the first electronic component and the top surface of the circuit layer is greater than a distance between the top surface of the first conductive element and the top surface of the circuit layer.

In one or more embodiments, according to another aspect, a semiconductor package device includes a circuit layer and a first electronic component disposed on the circuit layer, the first electronic component having a first lateral surface and a second lateral surface opposite to the first lateral surface. The semiconductor package device further includes a bonding wire that crosses a plane that includes the first lateral surface of the first electronic component and that connects the first electronic component to the circuit layer. The semiconductor package device further includes a first conductive element disposed on the circuit layer and adjacent to the first lateral surface, and a second conductive element disposed on the circuit layer and adjacent to the second lateral surface. A height of the first conductive element is less than a height of the second conductive element.

In one or more embodiments, according to another aspect, a semiconductor package device includes a circuit layer, a first electronic component disposed on the circuit layer, and a first conductive element disposed on the circuit layer and having a top surface. The semiconductor package device further includes a second conductive element disposed on the circuit layer and having a top surface, and a package body encapsulating the first electronic component, the first conductive element and the second conductive element. The package body has a top surface, and defines a first recess extending from the top surface of the package body to the top surface of the first conductive element and a second recess extending from the top surface of the package body to the top surface of the second conductive element. A depth of the first recess is different from a depth of the second recess.

In one or more embodiments, according to another aspect, a method of manufacturing a semiconductor package device includes providing a circuit layer, and forming a first conductive element and a first portion of a second conductive element on the circuit layer. The method of manufacturing a semiconductor package device further includes forming a second portion of the second conductive element on the first portion of the second conductive element, and disposing a first electronic component on the circuit layer and between the first conductive element and the second conductive element.

BRIEF DESCRIPTION OF THE DRAWINGS

Aspects of the present disclosure are best understood from the following detailed description when read with the accompanying Figures. It is noted that various features may not be drawn to scale, and the dimensions of the various features may be arbitrarily increased or reduced for clarity of discussion.

FIG. 6A, FIG. 6B, FIG. 6C, FIG. 6D, FIG. 6E, FIG. 6E'.

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1:
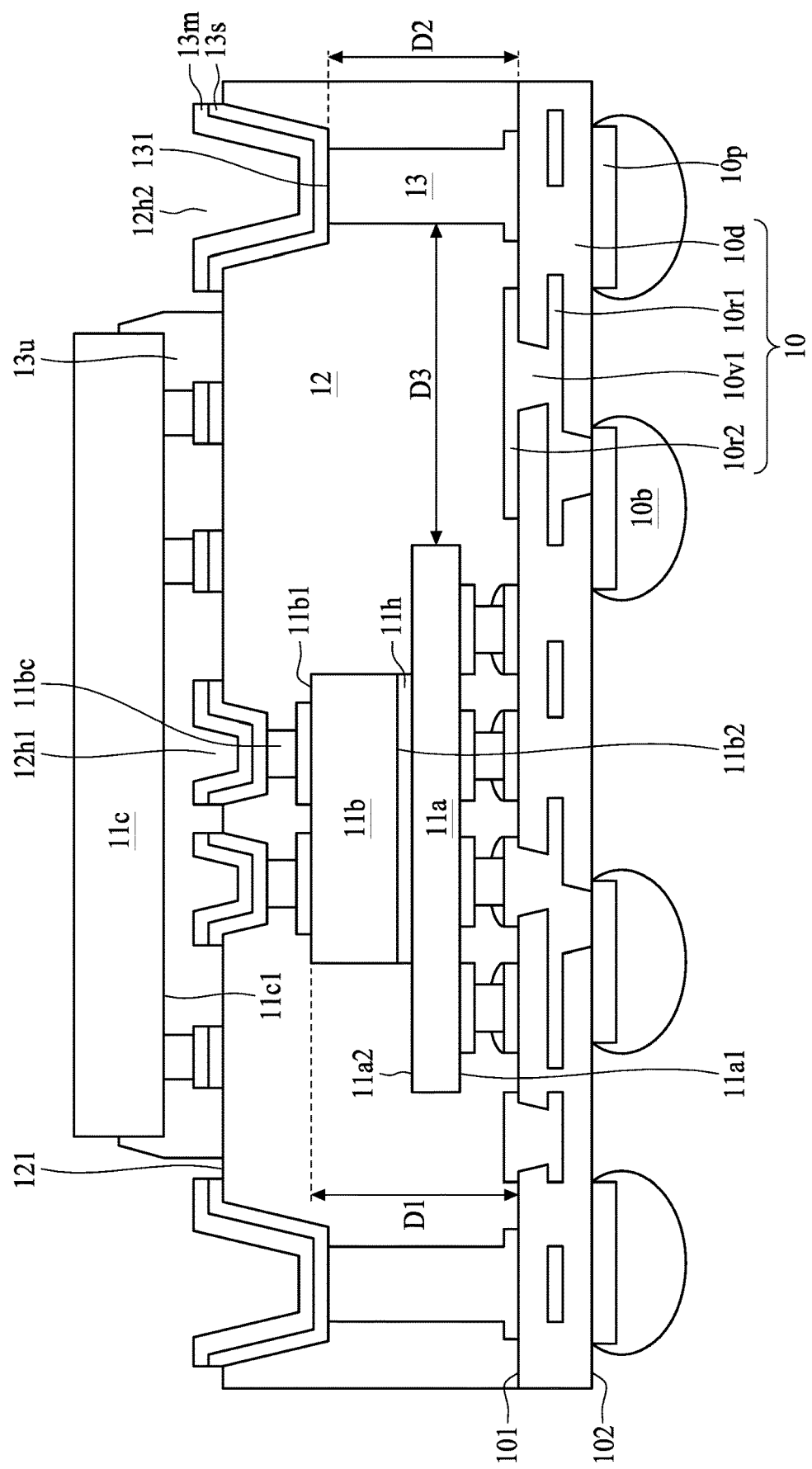
FIG. 1 illustrates a cross-sectional view of a semiconductor package device in accordance with some embodiments of the present disclosure.

FIG. 1 illustrates a cross-sectional view of a semiconductor package device 1 in accordance with some embodiments of the present disclosure. The semiconductor package device 1 includes a circuit layer 10, electronic components 11a, 11b, 11c, a package body 12 and a conductive element 13.

The circuit layer 10 includes a dielectric layer or an insulation layer 10d and conductive layers 10r1, 10r2 (which can include, for example, a metal layer) encapsulated or covered at least in part by the dielectric layer 10d. The conductive layers 10r1 and 10r2 are physically separated from each other and electrically connected through conductive interconnections 10v1 (e.g., vias). In some embodiments, the circuit layer 10 may include any number of dielectric layers and conductive layers. For example, the circuit layer 10 may include N dielectric layers and conductive layers, where N is an integer. In some embodiments, the dielectric layer 10d may include an organic component, a solder mask, a polyimide (PI), an epoxy, an Ajinomoto build-up film (ABF) or a molding compound.

The conductive layer 10r2 is exposed from the dielectric layer 10d to provide electrical connections on or at a top surface 101 (also referred to as a first surface) of the circuit layer 10. The circuit layer 10 may include multiple conductive pads 10p on its bottom surface 102 (also referred to as a second surface). Electrical contacts 10b are disposed on the conductive pads 10p of the circuit layer 10. In some embodiments, the electrical contacts 10b include a controlled collapse chip connection (C4) bump, a ball grid array (BGA) or a land grid array (LGA).

The electronic component 11a is disposed on the top surface 101 of the circuit layer 10. The electronic component 11a has an active surface 11a1 facing toward the top surface 101 of the circuit layer 10 and a back surface 11a2 opposite to the active surface 11a1. The electronic component 11a may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The electronic component 11b is disposed on the back surface 11a2 of the electronic component 11a. The electronic component 11b has an active surface 11b1 and a back surface 11b2 facing toward the back surface 11a2 of the electronic component 11a. In some embodiments, the back surface 11b2 of the electronic component 11b is attached to the back surface 11a2 of the electronic component 11a through an adhesive 11h (e.g., a glue or a tape). The electronic component 11b may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, the area of the electronic component 11b (e.g. the footprint of the electronic component 11b, or the area of the back surface 11b2) may be larger than, equal to or smaller than the area of the electronic component 11a depending on design specifications.

The conductive element 13 (e.g., a conductive pillar) is disposed on the conductive layer 10r2 of the circuit layer 10 and physically spaced apart from the electronic component 11a. In some embodiments, the conductive element 13 includes gold (Au), silver (Ag), copper (Cu), platinum (Pt), titanium (Ti), tungsten (Wu), nickel (Ni) or other suitable metals or alloys. In some embodiments, a top surface 131 of the conductive element may be substantially circle-shaped, square-shaped, rectangle-shaped, or triangle-shaped.

In some embodiments, a distance D1 between the active surface 11b1 of the electronic component 11b and the top surface 101 of the circuit layer 10 is greater than a distance D2 (e.g., a height of the conductive element 13) between the top surface 131 of the conductive element 13 and the top surface 101 of the circuit layer 10. For example, the top surface 131 of the conductive element 13 is disposed at a lower position than the active surface 11b1 of the electronic component 11b. In some embodiments, D2 is up to about 0.98 times D1 or less, up to about 0.95 times D1 or less, or up to about 0.9 times D1 or less. In some embodiments, a difference between D1 and D2 is less than or equal to about 220 micrometer (μm). In some embodiments, a distance D3 (e.g. a shortest distance) between the conductive element 13 and the electronic component 11a is in a range from about 1.89 μm to about 1432.2

The package body 12 is disposed on the top surface 101 of the circuit layer 10 and covers or encapsulates the conductive layer 10r2, the electronic component 11a, the electronic component 11b and the conductive element 13. An electrical contact 11bc on the active surface 11b1 of the electronic component 11b and the top surface 131 of the conductive element 13 are exposed from the package body 12. For example, the package body 12 defines openings 12h1, 12h2 or recesses that expose the electrical contact 11bc on the active surface 11b1 of the electronic component 11b and the top surface 131 of the conductive element 13, respectively. In some embodiments, a width of at least one of the openings 12h1, 12h2 can be larger than, equal to or less than a width of the conductive element 13 depending on design specifications. In some embodiments, the package body 12 includes, for example, organic materials (e.g., a molding compound, a bismaleimide triazine (BT), a PI, a polybenzoxazole (PBO), a solder resist, an ABF, a polypropylene (PP) or an epoxy-based material), inorganic materials (e.g., a silicon, a glass, a ceramic or a quartz), liquid and/or dry-film materials or a combination thereof.

A seed layer 13s is disposed on a top surface 121 of the package body 12 and extends within the openings 12h1, 12h2. A conductive layer 13m is disposed on the seed layer 13s. For example, the conductive layer 13m is disposed over the top surface 121 of the package body 12 and extends within the openings 12h1, 12h2 to electrically connect the electrical contact 11bc on the active surface 11b1 of the electronic component 11b to the top surface 131 of the conductive element 13. In some embodiments, the conductive layer 13m includes Cu, Ag, Au, Pt, Al or a solder alloy.

The electronic component 11c is disposed on the top surface 121 of the package body 12. The electronic component 11c has an active surface 11c1 facing toward the top surface 121 of the package body 12. In some embodiments, the electronic component 11c is disposed on the conductive layer 13m on the top surface 121 of the package body 12 and electrically connected to the electronic component 11b and/or the conductive element 13 through the conductive layer 13m. The electronic component 11c may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

In some embodiments, an underfill 13u may be disposed on the top surface 121 of the package body 12 to cover the active surface 11c1 of the electronic component 11c. In some embodiments, the underfill 13u includes an epoxy resin, a molding compound (e.g., an epoxy molding compound or other molding compound), a polyimide, a phenolic compound or material, a material including a silicone dispersed therein, or a combination thereof. In some embodiments, the underfill 13u may include a capillary underfill (CUF) or a molded underfill (MUF).

FIGS. 2A, 2B, 2C, 2D, 2E, 2F and 2G are cross-sectional views of a semiconductor structure at various stages of fabrication, in accordance with some embodiments of the present disclosure. Various figures have been simplified to provide a better understanding of the aspects of the present disclosure. In some embodiments, the structures shown in FIGS. 2A, 2B, 2C, 2D, 2E, 2F and 2G are used to manufacture the semiconductor package device 1 shown in FIG. 1. Alternatively, the structures shown in FIGS. 2A, 2B, 2C, 2D, 2E, 2F and 2G can be used to manufacture other semiconductor package devices.

Figure 2A:
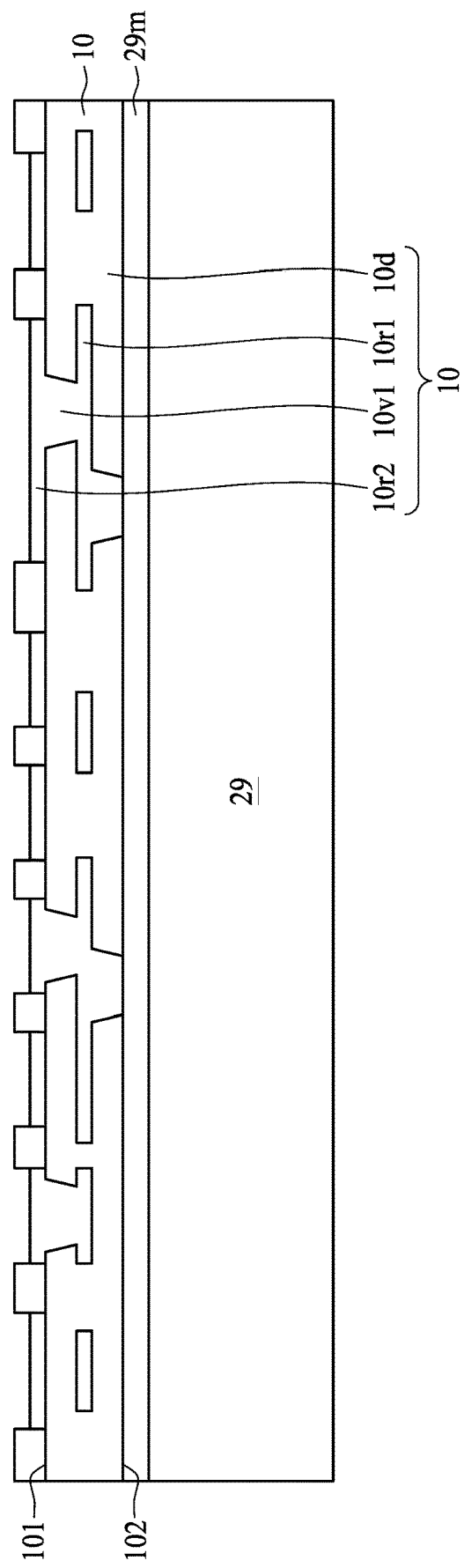
FIG. 2A, FIG. 2B, FIG. 2C, FIG. 2D, FIG. 2E, FIG. 2F and FIG. 2G illustrate a method of manufacturing a semiconductor package device in accordance with some embodiments of the present disclosure.

Referring to FIG. 2A, a carrier 29 is provided. A metal layer 29m is formed on the carrier 29 and then the circuit layer 10 is formed on the metal layer 29m. The circuit layer 10 includes the dielectric layer or insulation layer 10d and the conductive layers 10r1, 10r2 (which can include, for example, a metal layer) encapsulated or covered at least in part by the dielectric layer 10d. The conductive layers 10r1 and 10r2 are physically separated from each other and electrically connected through the conductive interconnections 10v1 (e.g., vias). In some embodiments, the circuit layer 10 may be formed by the following operations: (i) forming a photoresist or mask on the metal layer 29m; (ii) defining a predetermined pattern on the photoresist or mask by, for example, lithographic technique; (iii) plating conductive material to form the patterned conductive layers 10r1, 10r2; and (iv) removing the photoresist or mask. In some embodiments, a pitch of the conductive layer 10r1 is greater than that of the conductive layer 10r2.

Figure 2B:
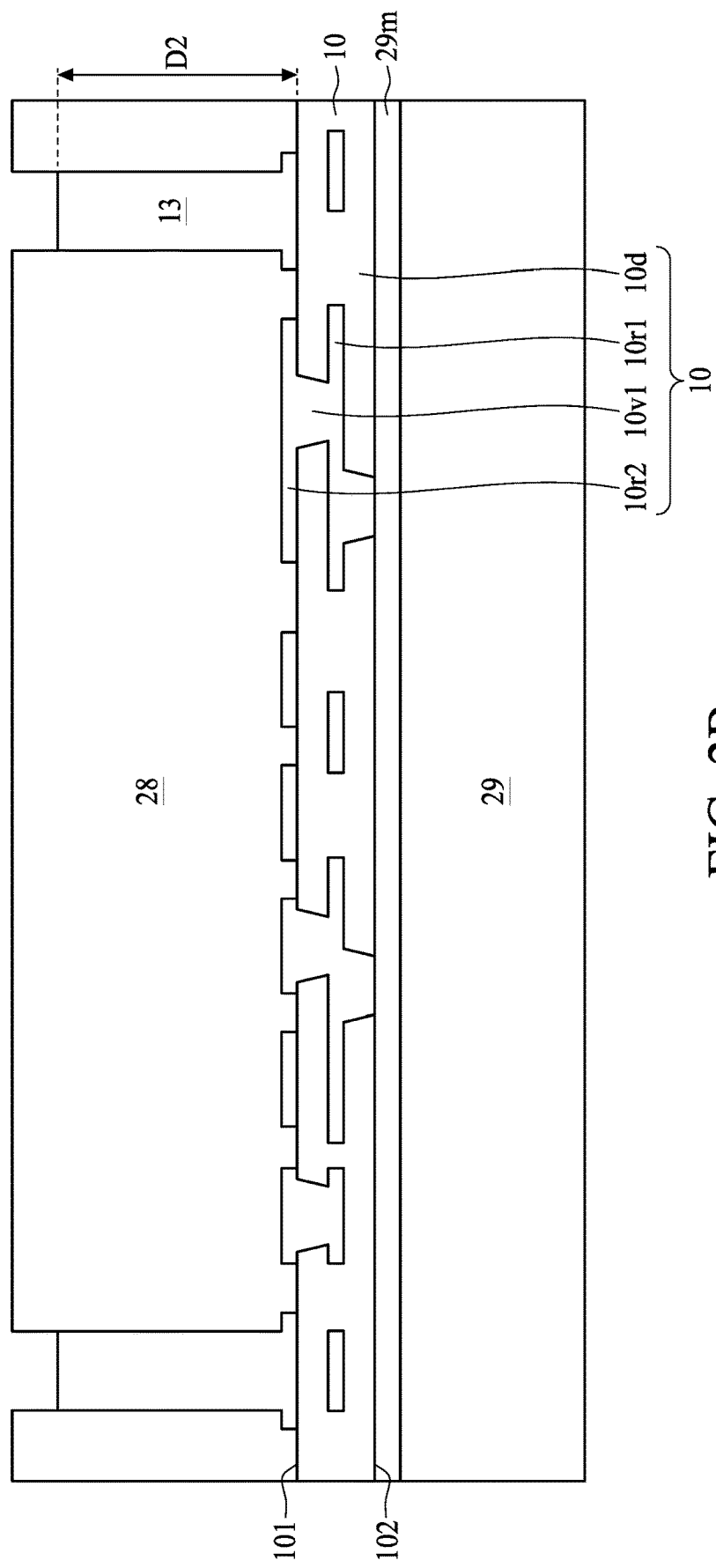

Referring FIG. 2B, a photoresist or mask 28 is disposed on the top surface 101 of the circuit layer 10. The photoresist 28 defines a plurality of openings that expose a portion of the conductive layer 10r2. The conductive elements 13 are formed within the openings by, for example, electroplating or other suitable processes.

Figure 2C:
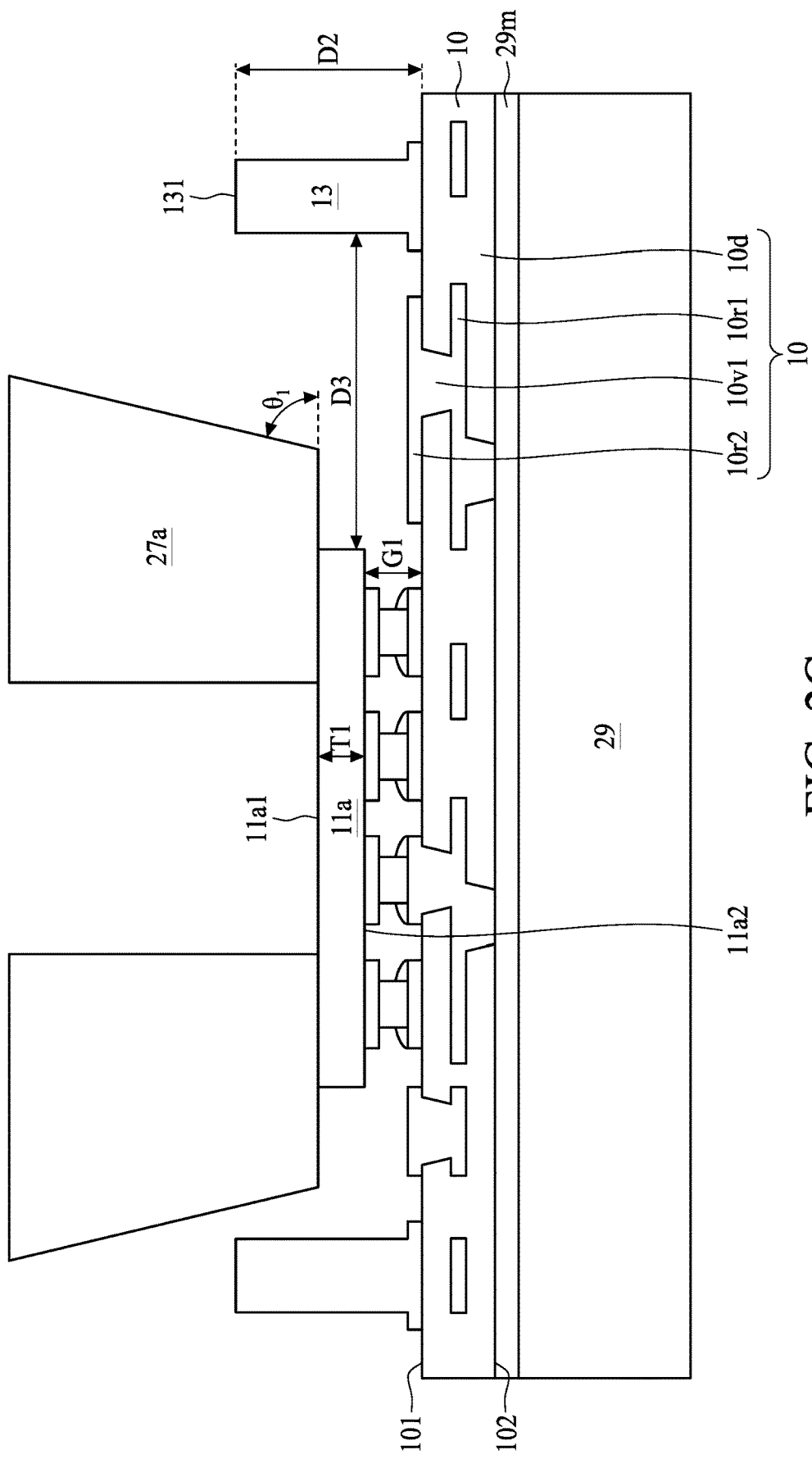

Referring to FIG. 2C, the photoresist 28 is removed, and the electronic component 11a is placed on the top surface 101 of the circuit layer 10. The electronic component 11a has an active surface 11a1 facing toward the top surface 101 of the circuit layer 10 and a back surface 11a2 opposite to the active surface 11a1. In some embodiments, the electronic component 11a is placed on the top surface 101 of the circuit layer 10 by using a vacuum nozzle 27a.

To avoid a collision between the vacuum nozzle 27a and the conductive element 13, the distance D3 between the electronic component 11a and the conductive element 13 may be set to satisfy the following equation:

$$D3 = \frac{(D2 - T1 - G1)}{\tan\theta 1} + Tc + Wt,$$  Eq. (1)

where D2 is the height of the conductive element 13; T1 is the thickness of the electronic component; G1 is a distance between the active surface 11a1 of the electronic component 11a and the top surface 101 of the circuit layer 10; Tc is a term that corresponds to a variation of the size of the electronic component 11a (e.g. a standard deviation of the width of the electronic component 11a corresponding to its method of manufacture); Wt is a term that corresponds to a variation of the width of the conductive element 13 (e.g. a standard deviation of the width of the conductive element 13 manufactured in the manner described above); and $\theta_1$ is an angle defined by the lateral surface of the vacuum nozzle 27a and a prolongation of the back surface 11a2 of the electronic component 11a. In some embodiments, $\theta_1$ is in a range from about 2° to about 88°. For example, in the case that T1 is in a range from about 50 μm to about 100 μm, D2 is in a range from about 30 μm to about 100 μm, G1 is in a range from about 10 μm to about 30 μm, Wt is in a range from about 0.1 μm to about 0.2 μm and Tc is in a range from about 0.05 μm to about 10 μm, the distance D3 between the electronic component 11a and the conductive element 13 can be derived from Eq (1) to be in a range from about 1.89 μm to about 1432.2 μm.

Figure 2D:
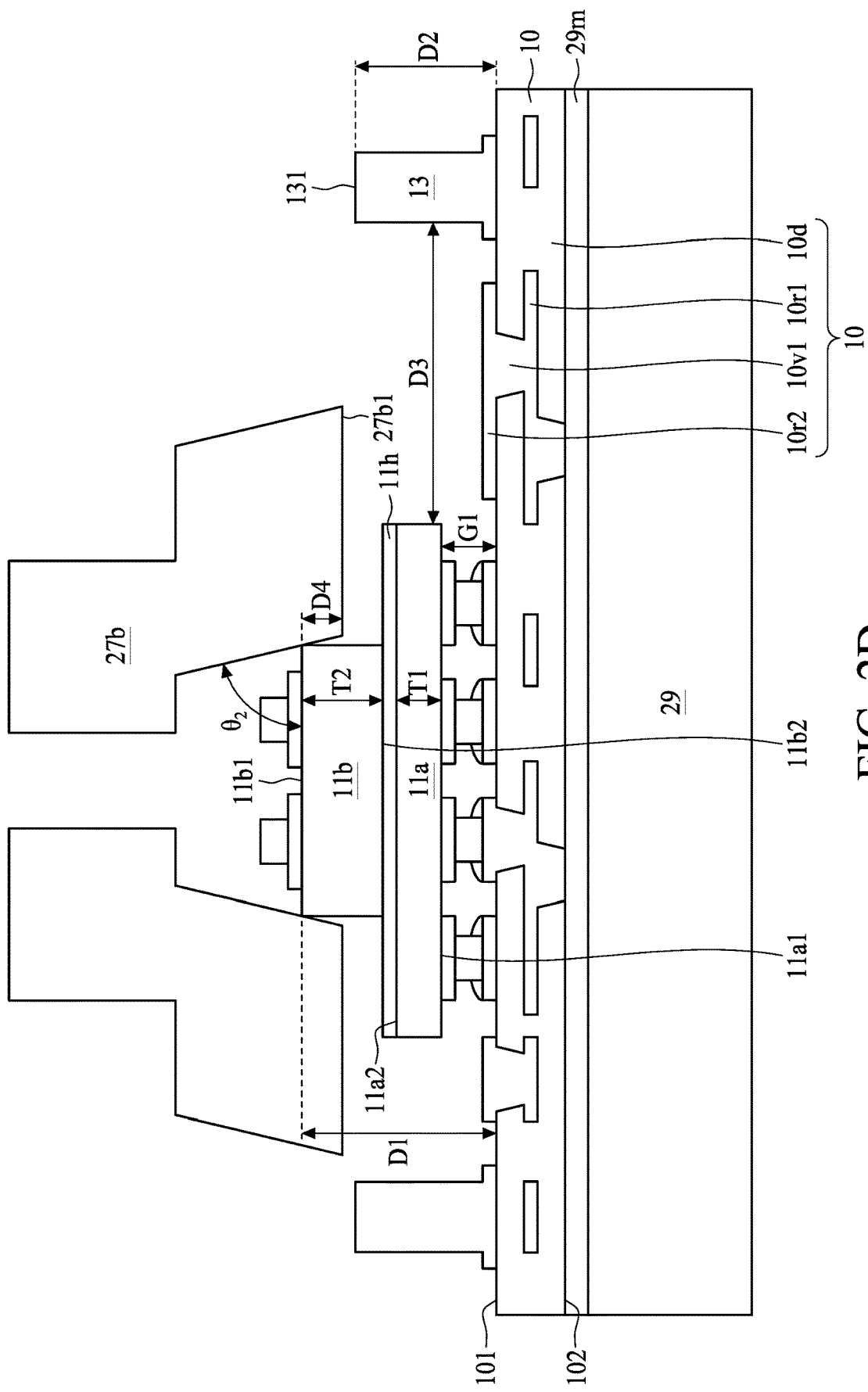

Referring to FIG. 2D, the electronic component 11b is placed on the back surface 11a2 of the electronic component 11a. The electronic component 11b has the active surface 11b1 and the back surface 11b2 facing toward the back surface 11a2 of the electronic component 11a. In some embodiments, the back surface 11b2 of the electronic component 11b is attached to the back surface 11a2 of the electronic component 11a through the adhesive 11h (e.g., a glue or a tape). In some embodiments, the electronic component 11b is placed on the back surface 11a2 of the electronic component 11a by using the vacuum nozzle 27b.

As shown in FIG. 2D, a distance D4 between the active surface 11b2 of the electronic component 11b and a bottom surface 27b1 of the vacuum nozzle 27b can be expressed by the following equation:

$$Tc2 \times \tan\theta 2 \leq D4 \leq T2$$  Eq. (2), where Tc2 is a variation of the size of the electronic component 11b (e.g. a standard deviation of the width of the electronic component 11b corresponding to its method of manufacture); $\theta_2$ is an angle defined by the internal lateral surface of the vacuum nozzle 27b and the active surface 11b1 of the electronic component 11b; and T2 is a thickness of the electronic component 11b. In some embodiments, $\theta_2$ is in a range from about 2° to about 88°. For example, in the case that T2 is in a range from about 50 μm to about 100 μm and Tc2 is in a range from about 0.05 μm to about 10 μm, the distance D4 between the active surface 11b2 of the electronic component 11b and a bottom surface 27b1 of the vacuum nozzle 27b can be derived from Eq (2) to be in a range from about 0.35 μm to about 100 μm.

To avoid a collision between the vacuum nozzle 27b and the conductive element 13, a distance D5 between the active surface 11b1 of the electronic component 11b and the top surface 131 of the conductive element 13 (corresponding to D1−D2) may be set to satisfy the following equation:

$$D5 \leq T1 + T2 + Ta + G1 - D2$$  Eq. (3), where Ta is the thickness of the adhesive 11h. For example, in the case that T1 or T2 is in a range from about 50 μm to about 100 μm, D2 is in a range from about 30 μm to about 100 μm, G1 is in a range from about 10 μm to about 30 μm, Ta is in a range from about 10 μm to about 20 μm, the distance D5 between the active surface 11b1 of the electronic component 11b and the top surface 131 of the conductive element 13 can be derived from Eq (3) to be in a range from zero μm (that is, the active surface 11b1 of the electronic component 11b and the top surface 131 of the conductive element 13 are substantially coplanar with each other) to about 220 μm.

By using the conductive element 13 with a height D2 less than the distance D1 between the active surface 11b1 of the electronic component 11b and the top surface 101 of the circuit layer 10 (e.g., selecting the distance D5 greater than zero), the distance D3 between the conductive element 13 and the electronic component 11a can be reduced while still providing for placing the electronic component 11b on the electronic component 11a. Therefore, dimensions of the semiconductor package device can be reduced as well.

Figure 2E:
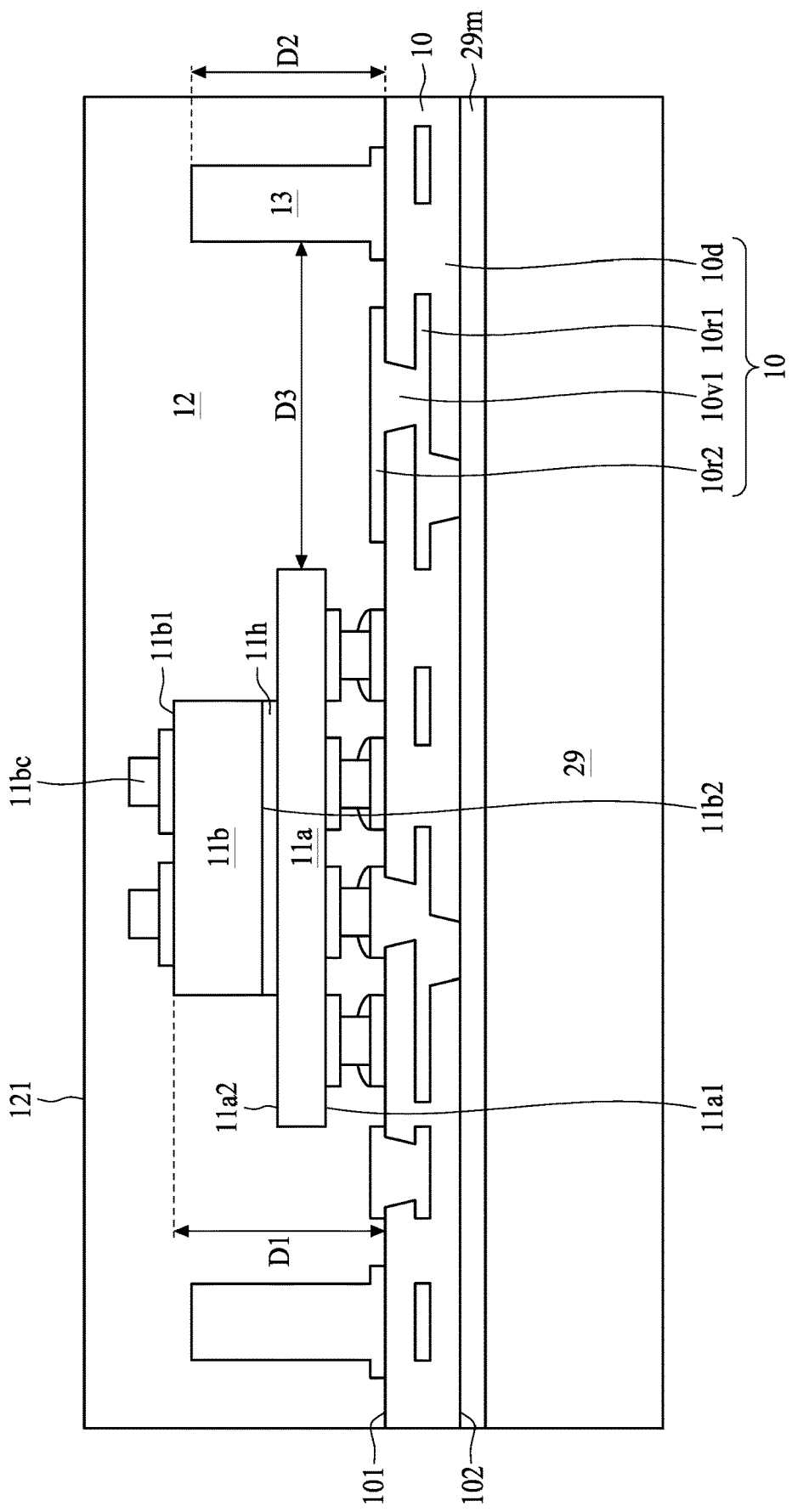

Referring to FIG. 2E, the package body 12 is formed on the top surface 101 of the circuit layer 10 to cover the electronic components 11a, 11b and the conductive element 13. In some embodiments, the package body 12 includes, for example, organic materials (e.g., a molding compound, a BT, a PI, a PBO, a solder resist, an ABF, a PP or an epoxy-based material), inorganic materials (e.g., a silicon, a glass, a ceramic or a quartz), liquid and/or dry-film materials or a combination thereof. The package body 12 may be formed by a molding technique, such as transfer molding or compression molding.

Figure 2F:
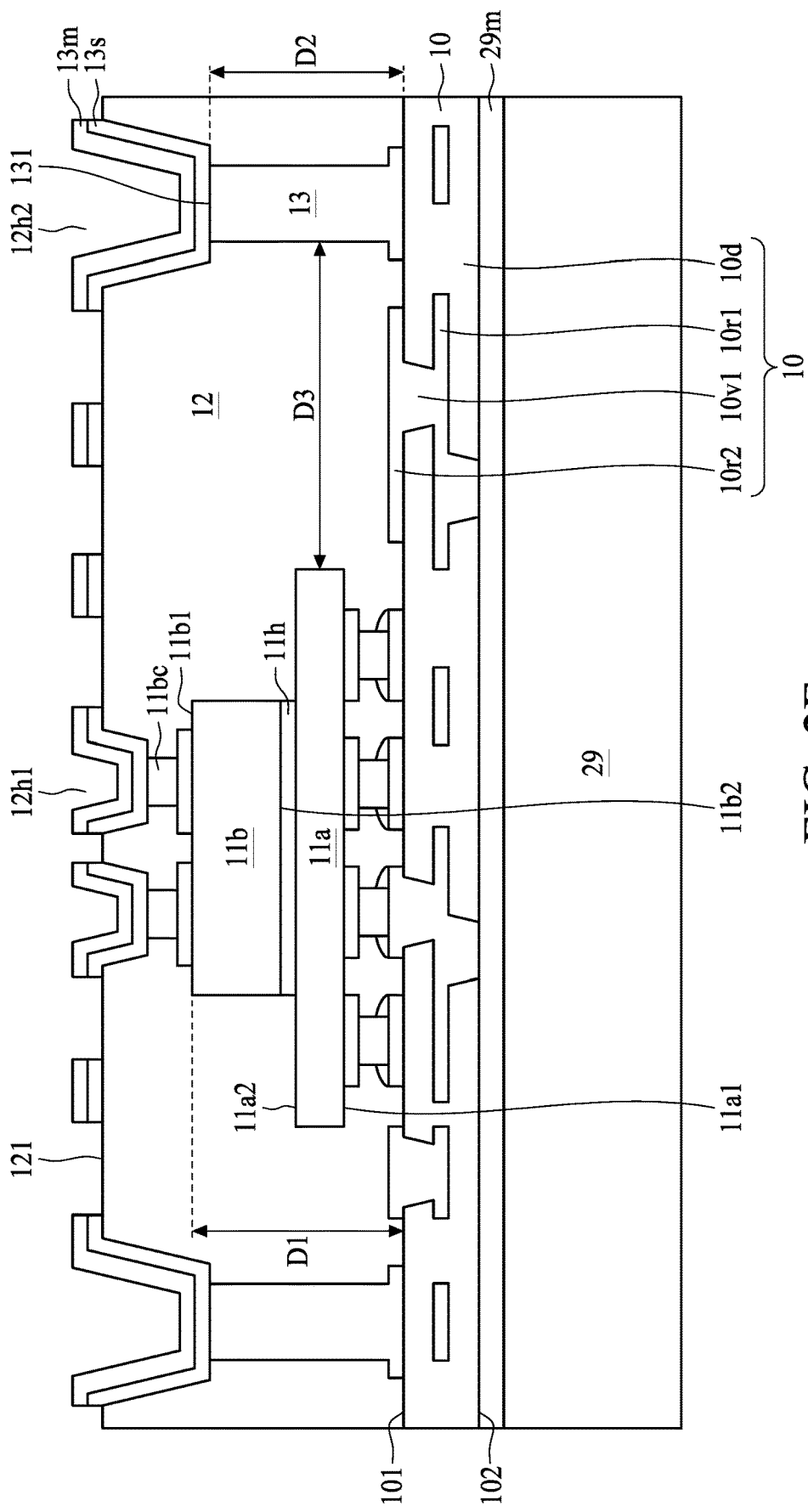

Referring to FIG. 2F, a plurality of openings 12h1, 12h2 are formed in the package body 12 to expose the electrical contact 11bc on the active surface 11b1 of the electronic component 11b and the top surface 131 of the conductive element 13. In some embodiments, the openings can be formed by laser drilling, etching or other suitable processes. In some embodiments, the width of the openings 12h1, 12h2 can be larger than, equal to or less than the width of the conductive element 13 depending on design specifications.

The seed layer 13s is formed on the top surface 121 of the package body 12 and extends within the openings 12h1, 12h2. The conductive layer 13m is then formed on the seed layer 13s. For example, the conductive layer 13m is formed over the top surface 121 of the package body 12 and extends within the openings 12h1, 12h2. In some embodiments, the seed layer 13s and the conductive layer 13m may be formed by the following operations: (i) forming a seed layer on the top surface 121 of the package body 12 and extending within the openings 12h1, 12h2 by using chemical vapor deposition (CVD) or physical vapor deposition (PVD); (ii) placing a photoresist or mask on the seed layer; (iii) defining a predetermined pattern on the photoresist or mask by, for example, lithographic technique; (iv) disposing or forming a conductive material on the seed layer to form the patterned conductive layer; (v) removing the photoresist or mask; and (vi) removing a portion of the seed layer that is not covered by the patterned conductive layer. In some embodiments, in the operation (iv), the conductive material can be formed on the seed layer by electroplating, electroless plating, sputtering, paste printing, bumping or bonding.

Figure 2G:
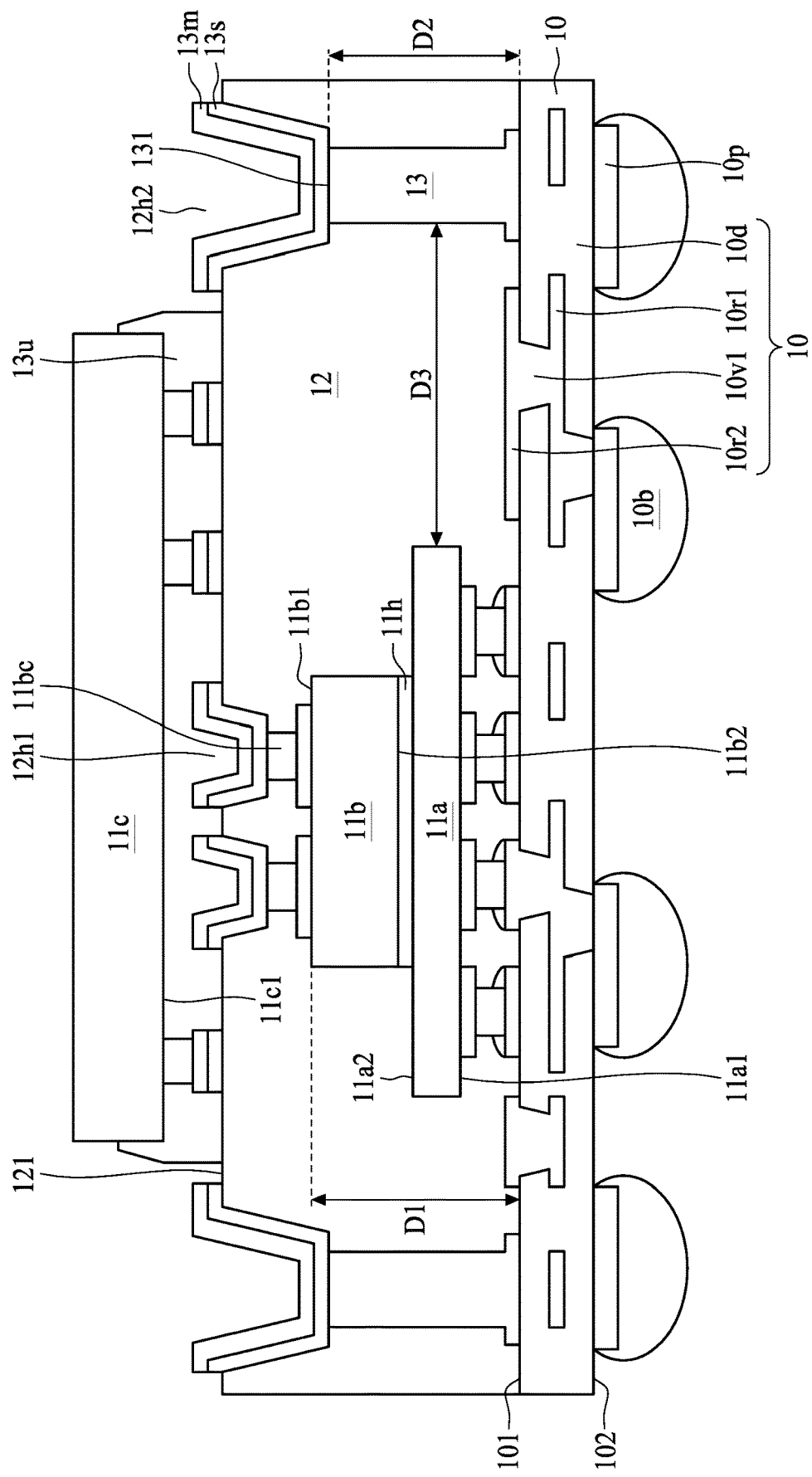

Referring to FIG. 2G, the electronic component 11c is placed on the conductive layer 13m on the top surface 121 of the package body 12 and electrically connected to the electronic component 11b and/or the conductive element 13 through the conductive layer 13m. In some embodiments, the underfill 13u may be formed on the top surface 121 of the package body 12 to cover the active surface 11c1 of the electronic component 11c. In some embodiments, the underfill 13u includes an epoxy resin, a molding compound (e.g., an epoxy molding compound or other molding compound), a polyimide, a phenolic compound or material, a material including a silicone dispersed therein, or a combination thereof. In some embodiments, the underfill 13u may include a CUF or a MUF.

The carrier 29 is removed and a portion of the metal layer 29m is removed to form the conductive pads 10p of the conductive layer 10. In some embodiments, the portion of the metal layer 29m can be removed by etching or other suitable processes. The electrical contacts 10b are then formed on the conductive pads 10p to form the semiconductor package device 1 as shown in FIG. 1. In some embodiments, the electrical contacts 10b can include a C4 bump, a BGA or an LGA. In some embodiments, the electrical contacts 10b can be formed by electroplating, electroless plating, sputtering, paste printing, bumping or bonding.

Figure 3A:
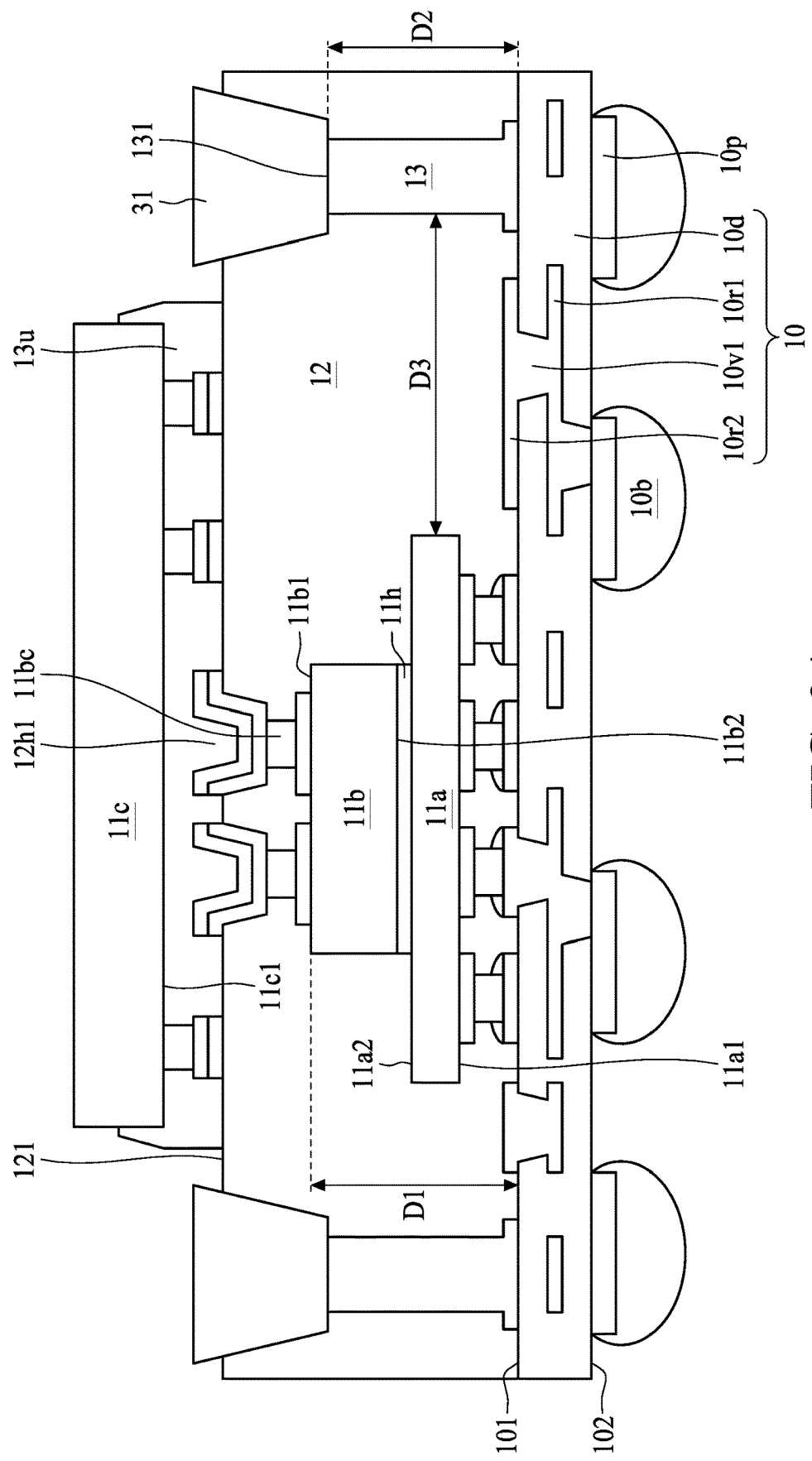
FIG. 3A illustrates a cross-sectional view of a semiconductor package device in accordance with some embodiments of the present disclosure.

FIG. 3A illustrates a cross-sectional view of a semiconductor package device 3A in accordance with some embodiments of the present disclosure. The semiconductor package device 3A is similar to the semiconductor package device 1 shown in FIG. 1 except that the semiconductor package device 3A further includes a solder 31.

The solder 31 is disposed within the opening 12h2 of the package body 12 shown in FIG. 1. The solder 31 is electrically connected to the top surface 131 of the conductive element 13. In some embodiments, the seed layer 13s and the conductive layer 13m within the opening 12h2 can be omitted, and the solder 31 can directly contact the top surface 131 of the conductive element 13. Alternatively, the seed layer 13s and the conductive layer 13m are disposed within the opening 12h2 and contact the top surface 131 of the conductive element 13, and thus the solder 31 is disposed on the conductive layer 13m.

Figure 3B:
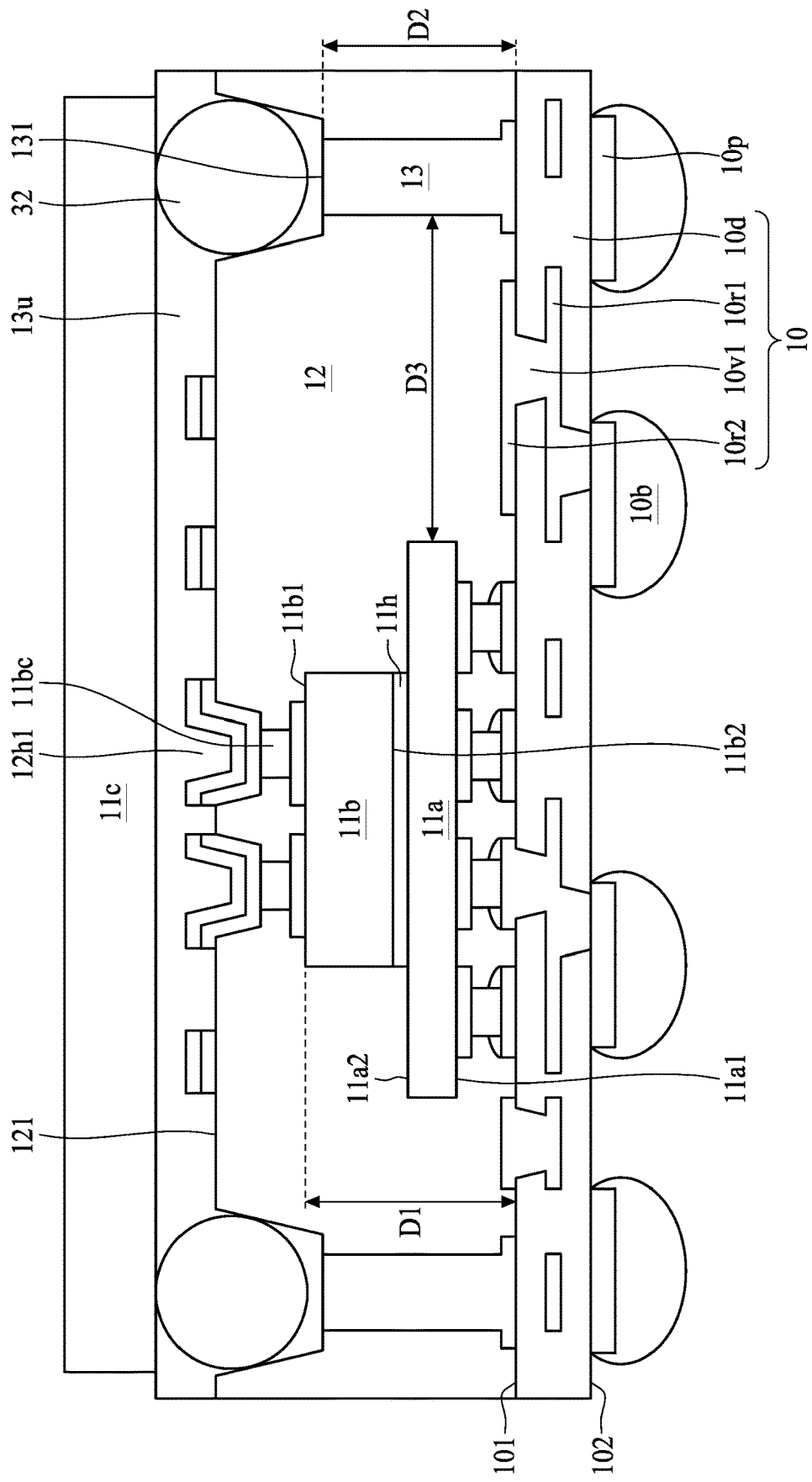
FIG. 3B illustrates a cross-sectional view of a semiconductor package device in accordance with some embodiments of the present disclosure.

FIG. 3B illustrates a cross-sectional view of a semiconductor package device 3B in accordance with some embodiments of the present disclosure. The semiconductor package device 3B is similar to the semiconductor package device 1 shown in FIG. 1 except that the electronic component 11c includes one or more solder balls 32 disposed within the opening 12h2 of the package body 12 shown in FIG. 1 and electrically connected to the top surface 131 of the conductive element 13.

Figure 3C:
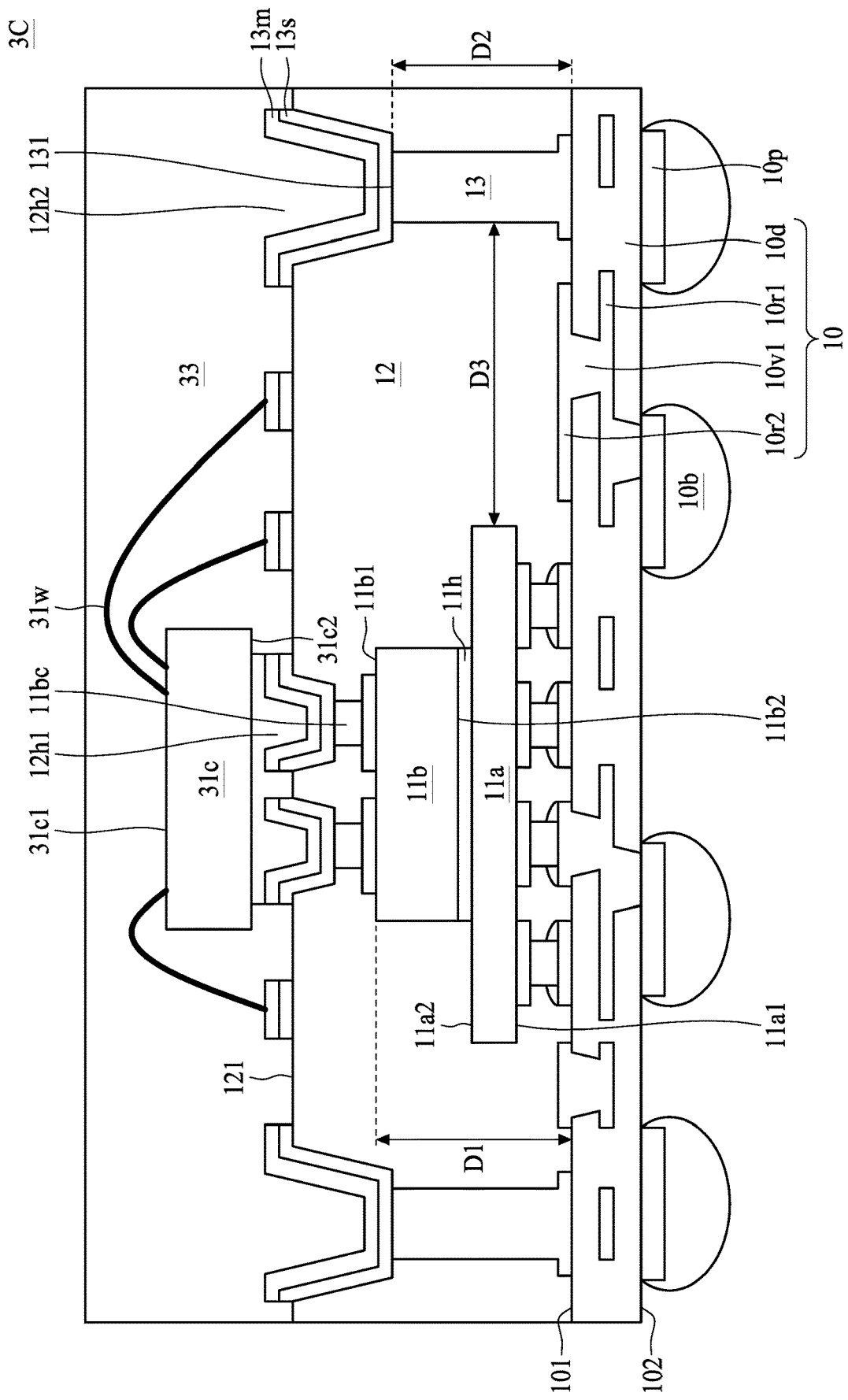
FIG. 3C illustrates a cross-sectional view of a semiconductor package device in accordance with some embodiments of the present disclosure.

FIG. 3C illustrates a cross-sectional view of a semiconductor package device 3C in accordance with some embodiments of the present disclosure. The semiconductor package device 3C is similar to the semiconductor package device 1 shown in FIG. 1 except that the semiconductor package device 3C includes an electronic component 31c in place or the electronic component 11c. A back surface 31c2 of the electronic component 31c faces toward the top surface 121 of the package body 12. The electronic component 31c has a front surface 31c1 opposite to the back surface 31c2. The electronic component 31c of the semiconductor package device 3C is electrically connected to the conductive layer 13m through bonding wires 31w. The bonding wires 31w may be attached to the front surface 31c1.

Figure 3D:
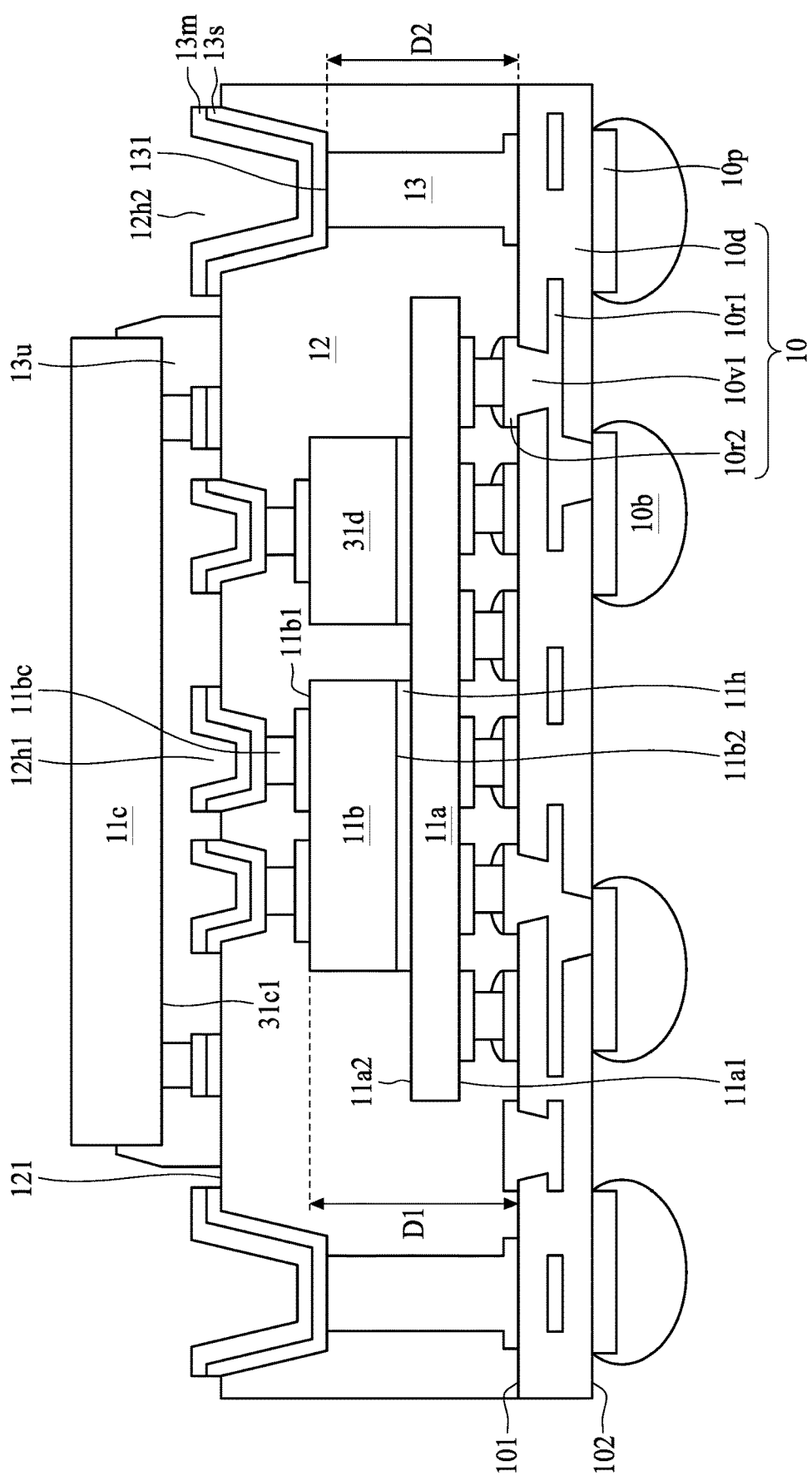
FIG. 3D illustrates a cross-sectional view of a semiconductor package device in accordance with some embodiments of the present disclosure.

FIG. 3D illustrates a cross-sectional view of a semiconductor package device 3D in accordance with some embodiments of the present disclosure. The semiconductor package device 3D is similar to the semiconductor package device 1 shown in FIG. 1 except that the semiconductor package device 3D further includes an electronic component 31d disposed on the back surface 11a2 of the electronic component 11a and adjacent to the electronic component 11b. In some embodiments, the number of the electronic components on the electronic component 11a or the number of the electronic components on the circuit layer 10 varies depending on design specifications.

Figure 3E:
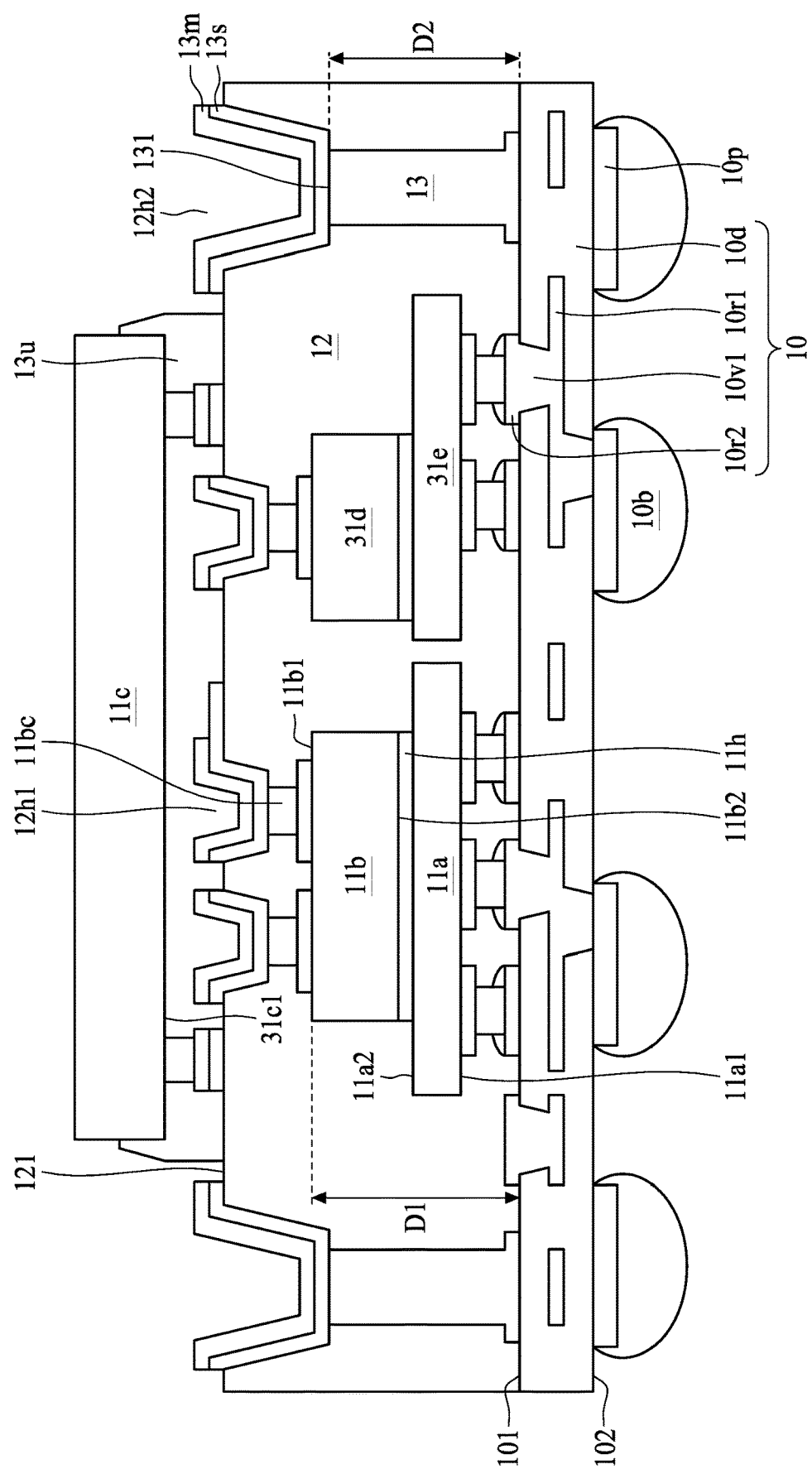
FIG. 3E illustrates a cross-sectional view of a semiconductor package device in accordance with some embodiments of the present disclosure.

FIG. 3E illustrates a cross-sectional view of a semiconductor package device 3E in accordance with some embodiments of the present disclosure. The semiconductor package device 3E is similar to the semiconductor package device 1 shown in FIG. 1 except that the semiconductor package device 3E further includes an electronic component 31e and an electronic component 31d. The electronic component 31e is disposed on the circuit layer 10 and spaced apart from the electronic component 11a. The electronic component 31d is disposed on the electronic component 31e.

Figure 4B:
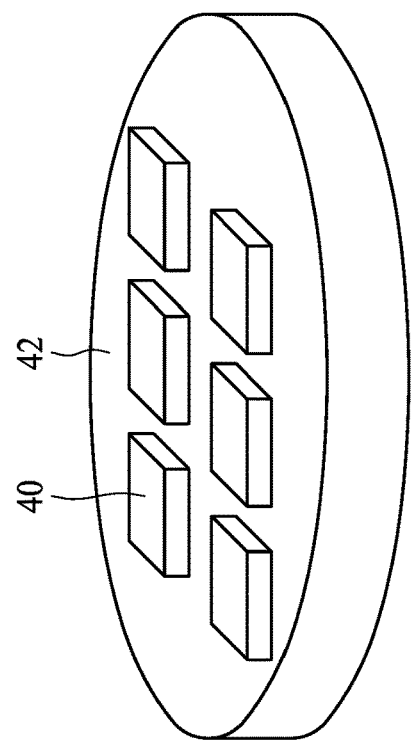
FIG. 4A and FIG. 4B illustrate different types of semiconductor package devices in accordance with some embodiments of the present disclosure.
Figure 4A:
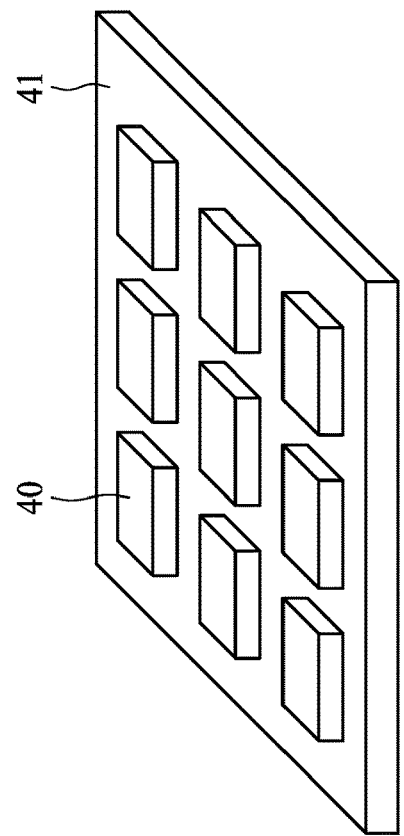

FIGS. 4A and 4B illustrate different types of semiconductor package devices in accordance with some embodiments of the present disclosure.

As shown in FIG. 4A, a plurality of chips 40 or dies are placed on a substantially square-shaped carrier 41. In some embodiments, the carrier 41 may include organic materials (e.g., a molding compound, a BT, a PI, a PBO, a solder resist, an ABF, a PP or an epoxy-based material) or inorganic materials (e.g., a silicon, a glass, a ceramic or a quartz).

As shown in FIG. 4B, a plurality of chips 40 or dies are placed on a substantially circle-shaped carrier 42. In some embodiments, the carrier 42 may include organic materials (e.g., a molding compound, a BT, a PI, a PBO, a solder resist, an ABF, a PP or an epoxy-based material) or inorganic materials (e.g., a silicon, a glass, a ceramic or a quartz).

Figure 5:
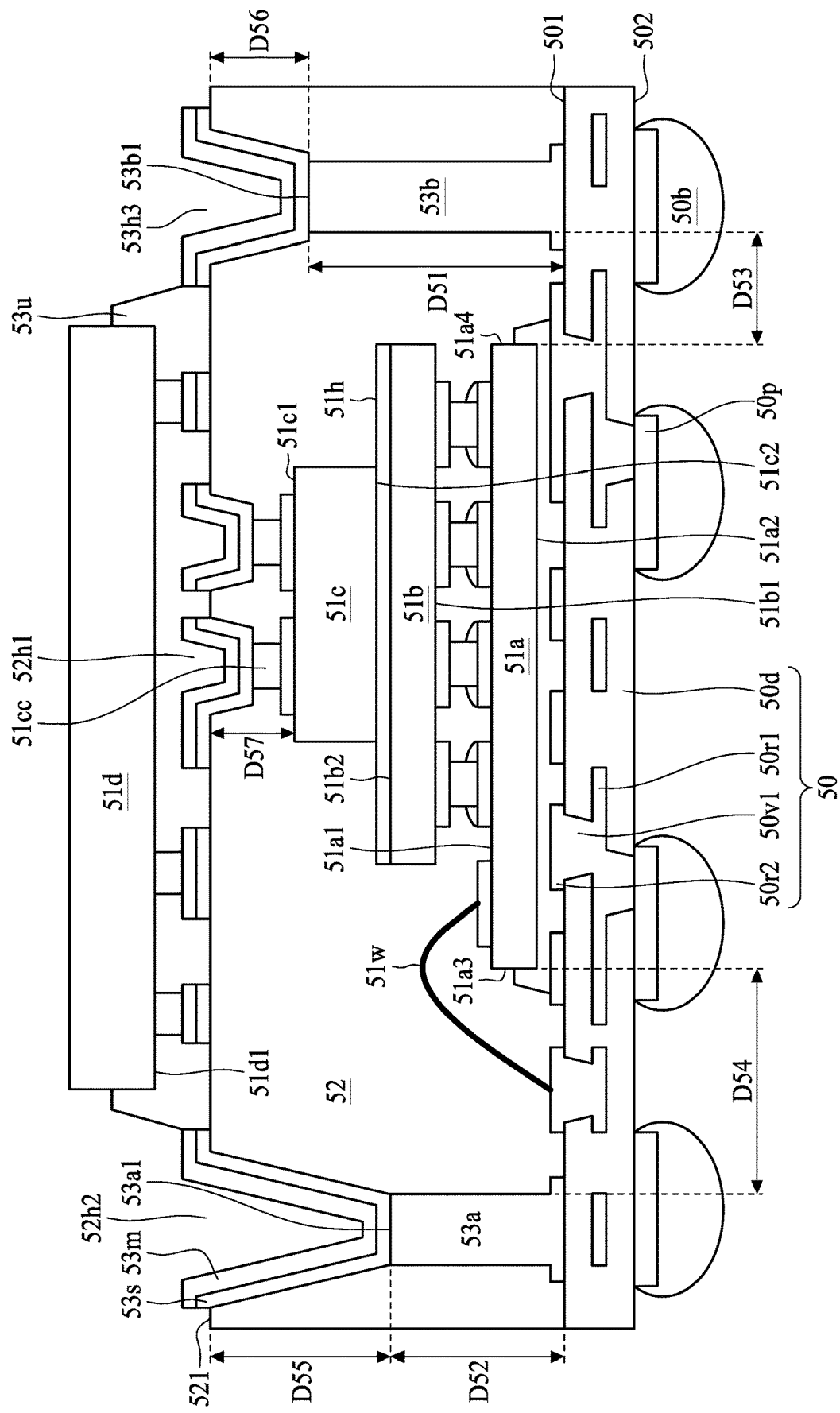
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 includes a circuit layer 50, electronic components 51a, 51b, 51c, 51d, a package body 52 and conductive elements 53a, 53b.

The circuit layer 50 includes a dielectric layer or an insulation layer 50d and conductive layers 50r1, 50r2 (which can include, for example, a metal layer) encapsulated or covered at least in part by the dielectric layer 50d. The conductive layers 50r1 and 50r2 are physically separated from each other and electrically connected through conductive interconnections 50v1 (e.g., vias). In some embodiments, the circuit layer 50 may include any number of dielectric layers and conductive layers. For example, the circuit layer 50 may include N dielectric layers and conductive layers, where N is an integer. In some embodiments, the dielectric layer 50d may include an organic compound, a solder mask, a PI, an epoxy, an ABF or a molding compound.

The conductive layer 50r2 is exposed from the dielectric layer 50d to provide electrical connections on a top surface 501 (also referred to as a first surface) of the circuit layer 50. The circuit layer 50 may include multiple conductive pads 50p on its bottom surface 502 (also referred to as a second surface). Electrical contacts 50b are disposed on the conductive pads 50p of the circuit layer 50. In some embodiments, the electrical contacts 50b include a C4 bump, a BGA or an LGA.

The electronic component 51a is disposed on the top surface 501 of the circuit layer 50. The electronic component 51a has an active surface 51a1, a back surface 51a2 facing toward the top surface 501 of the circuit layer 50, a first lateral surface 51a3 extending between of the active surface 51a1 and the back surface 51a2 and a second lateral surface 51a4 opposite to the first lateral surface 51a3. The electronic component 51a may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof. In some embodiments, one or more conductive contacts on the active surface 51a1 of the electronic component 51a are connected to the conductive layer 50r2 through a bonding wire 51w. In some embodiments, the bonding wire 51w passes across a plane that includes, or is aligned with, the first lateral surface 51a3 of the electronic component 51a to connect the electronic component 51a to the circuit layer 50.

The electronic component 51b is disposed on the active surface 51a1 of the electronic component 51a. The electronic component 51b has an active surface 51b1 facing toward the active surface 51a1 of the electronic component 51a and a back surface 51b2 opposite to the active surface 51a1. In some embodiments, one or more conductive contacts on the active surface 51b1 of the electronic component 51b are electrically connected conductive contacts on the active surface 51a1 of the electronic component 51a that are not electrically connected to the conductive layer 50r2 of the circuit layer 50 through the bonding wire 51w. The electronic component 51b may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The electronic component 51c is disposed on the back surface 51b2 of the electronic component 51b. The electronic component 51c has an active surface 51c1 and a back surface 51c2 facing toward the back surface 51b2 of the electronic component 51b. In some embodiments, the back surface 51c2 of the electronic component 51c is attached to the back surface 51b2 of the electronic component 51b through an adhesive 51h (e.g., a glue or a tape). The electronic component 51c may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

The conductive element 53a (e.g., a conductive pillar, also referred to "first conductive element") is disposed on the conductive layer 50r2 of the circuit layer 50. The conductive element 53a is adjacent to the lateral surface 51a3 of the electronic component 51a and physically spaced apart from the electronic component 51a. For example, the conductive element 53a is adjacent to the bonding wire 51w. In some embodiments, the conductive element 53a includes Au, Ag, Cu, Pt, Ti, Wu, Ni or other suitable metals or alloys. In some embodiments, a top surface 53a1 of the conductive element 53a may be substantially circle-shaped, square-shaped, rectangle-shaped, or triangle-shaped.

The conductive element 53b (e.g., a conductive pillar, also referred to "second conductive element") is disposed on the conductive layer 50r2 of the circuit layer 50. The conductive element 53b is adjacent to the lateral surface 51a4 of the electronic component 51a and physically spaced apart from the electronic component 51a. For example, the conductive element 53b is further away from the bonding wire 51w (e.g. further away from the bonding wire w1 than is the conductive element 53a). In some embodiments, the conductive element 53b includes Au, Ag, Cu, Pt, Ti, Wu, Ni or other suitable metals or alloys. In some embodiments, a top surface 53b1 of the conductive element 53b may be substantially circle-shaped, square-shaped, rectangle-shaped, or triangle-shaped.

In some embodiments, a height D51 of the conductive element 53b (e.g. a distance between a top surface 53b1 of the conductive element 53b and the top surface 501 of the circuit layer 50) is greater than a height D52 of the conductive element 53a (e.g. a distance between a top surface 53a1 of the conductive element 53a and the top surface 501 of the circuit layer 50). In some embodiments, a difference between D51 and D52 (e.g. a difference in vertical position between the top surface 53b1 of the conductive element 53b and the top surface 53a1 of the conductive element 53a) is greater than about 5 μm. In some embodiments, D52 is up to about 0.98 times D51 or less, up to about 0.95 times D51 or less, or up to about 0.9 times D51 or less. In some embodiments, a distance between the active surface 51c1 and the top surface 501 of the circuit layer 50 is greater than the height D51 of the conductive element 53b. In some embodiments, a distance D53 between the electronic component 51a and the conductive element 53b is less than a distance D54 between the electronic component 51a and the conductive element 53a. In some embodiments, the distance D53 between the electronic component 51a and the conductive element 53b is greater than about 100 μm. In some embodiments, the distance D54 between the electronic component 51a and the conductive element 53a is greater than about 200 μm.

The package body 52 is disposed on the top surface 501 of the circuit layer 50 and covers or encapsulates the conductive layer 50r2, the electronic components 51a, 51b, the electronic component 51c, the conductive element 53a and the conductive element 53b. An electrical contact 51cc on the active surface 51c1 of the electronic component 51c, the top surface 53a1 of the conductive element 53a and the top surface 53b1 of the conductive element 53b are exposed from the package body 52. For example, the package body 52 defines openings 52h1, 52h2, 53h3 or recesses that expose the electrical contact 51cc on the active surface 51c1 of the electronic component 51c, the top surface 53a1 of the conductive element 53a and the top surface 53b1 of the conductive element 53b.

In some embodiments, a width of the opening 52h2 can be larger than, equal to or less than the width of the conductive element 53a depending on design specifications. In some embodiments, the width of the opening 52h3 can be larger than, equal to or less than the width of the conductive element 53b depending on design specifications. In some embodiments, a depth D55 of the opening 52h2 (e.g. a distance between a top surface 521 of the package body 52 and the top surface 53a1 of the conductive element 53a) is greater than a depth D56 of the opening 53h3 (e.g. a distance between the top surface 521 of the package body 52 and the top surface 53b1 of the conductive element 53b). In some embodiments, a distance D57 between the top surface 521 of the package body 52 and the active surface 51c1 of the electronic component 51c is less than the depth D56 of the opening 53h3 and/or the depth D55 of the opening 53h2.

In some embodiments, the package body 52 includes, for example, organic materials (e.g., a molding compound, a BT, a PI, a PBO, a solder resist, an ABF, a PP or an epoxy-based material), inorganic materials (e.g., a silicon, a glass, a ceramic or a quartz), liquid and/or dry-film materials or a combination thereof.

A seed layer 53s is disposed on the top surface 521 of the package body 52 and extends within the openings 52h1, 52h2 and 52h3. A conductive layer 53m is disposed on the seed layer 53s. For example, the conductive layer 53m is disposed over the top surface 521 of the package body 52 and extends within the openings 52h1, 52h2 and 52h3 to electrically connect the electrical contact 51cc on the active surface 51c1 of the electronic component 51c to the top surface 53a1 of the conductive element 53a and/or the top surface 53b1 of the conductive element 53b. In some embodiments, the conductive layer 53m includes Cu, Ag, Au, Pt, Al or a solder alloy.

The electronic component 51d is disposed on the top surface 521 of the package body 52. The electronic component 51d has an active surface 51d1 facing toward the top surface 521 of the package body 52. In some embodiments, the electronic component 51d is disposed on the conductive layer 53m on the top surface 521 of the package body 52 and electrically connected to the electronic component 51c and/or the conductive elements 51a, 51b through the conductive layer 53m. The electronic component 51d may include a chip or a die including a semiconductor substrate, one or more integrated circuit devices and one or more overlying interconnection structures therein. The integrated circuit devices may include active devices such as transistors and/or passive devices such resistors, capacitors, inductors, or a combination thereof.

In some embodiments, an underfill 53u may be disposed on the top surface 521 of the package body 52 to cover the active surface 51d1 of the electronic component 51d. In some embodiments, the underfill 53u includes an epoxy resin, a molding compound (e.g., an epoxy molding compound or other molding compound), a polyimide, a phenolic compound or material, a material including a silicone dispersed therein, or a combination thereof. In some embodiments, the underfill 53u may include a CUF or a MUF.

FIGS. 6A, 6B, 6C, 6D, 6E, 6E', 6F, 6G, 6H and 6I are cross-sectional views of a semiconductor structure at various stages of fabrication, in accordance with some embodiments of the present disclosure. Various figures have been simplified to provide a better understanding of the aspects of the present disclosure. In some embodiments, the structures shown in FIGS. 6A, 6B, 6C, 6D, 6E, 6F, 6G, 6H and 6I are used to manufacture the semiconductor package device 5 shown in FIG. 5. Alternatively, the structures shown in FIGS. 6A, 6B, 6C, 6D, 6E, 6F, 6G, 6H and 6I can be used to manufacture other semiconductor package devices.

Figure 6A:
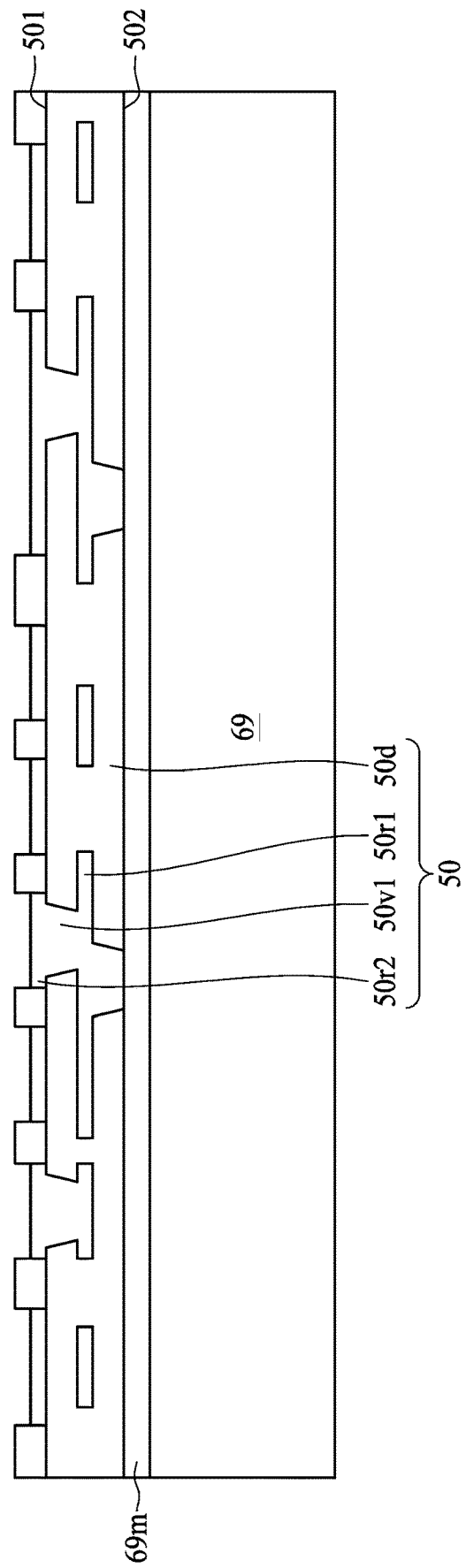

Referring to FIG. 6A, a carrier 69 is provided. A metal layer 69m is formed on the carrier 69 and then the circuit layer 50 is formed on the metal layer 69m. The circuit layer 50 includes the dielectric layer or insulation layer 50d and conductive layers 50r1, 50r2 (which can include, for example, a metal layer) encapsulated or covered at least in part by the dielectric layer 50d. The conductive layers 50r1 and 50r2 are physically separated from each other and electrically connected through the conductive interconnections 50v1 (e.g., vias). In some embodiments, the circuit layer 50 may be formed by the following operations: (i) forming a photoresist or mask on the metal layer 69m; (ii) defining a predetermined pattern on the photoresist or mask by, for example, lithographic technique; (iii) plating conductive material to form the patterned conductive layers 50r1, 50r2; and (iv) removing the photoresist or mask. In some embodiments, a pitch of the conductive layer 50r1 is greater than that of the conductive layer 50r2.

Figure 6B:
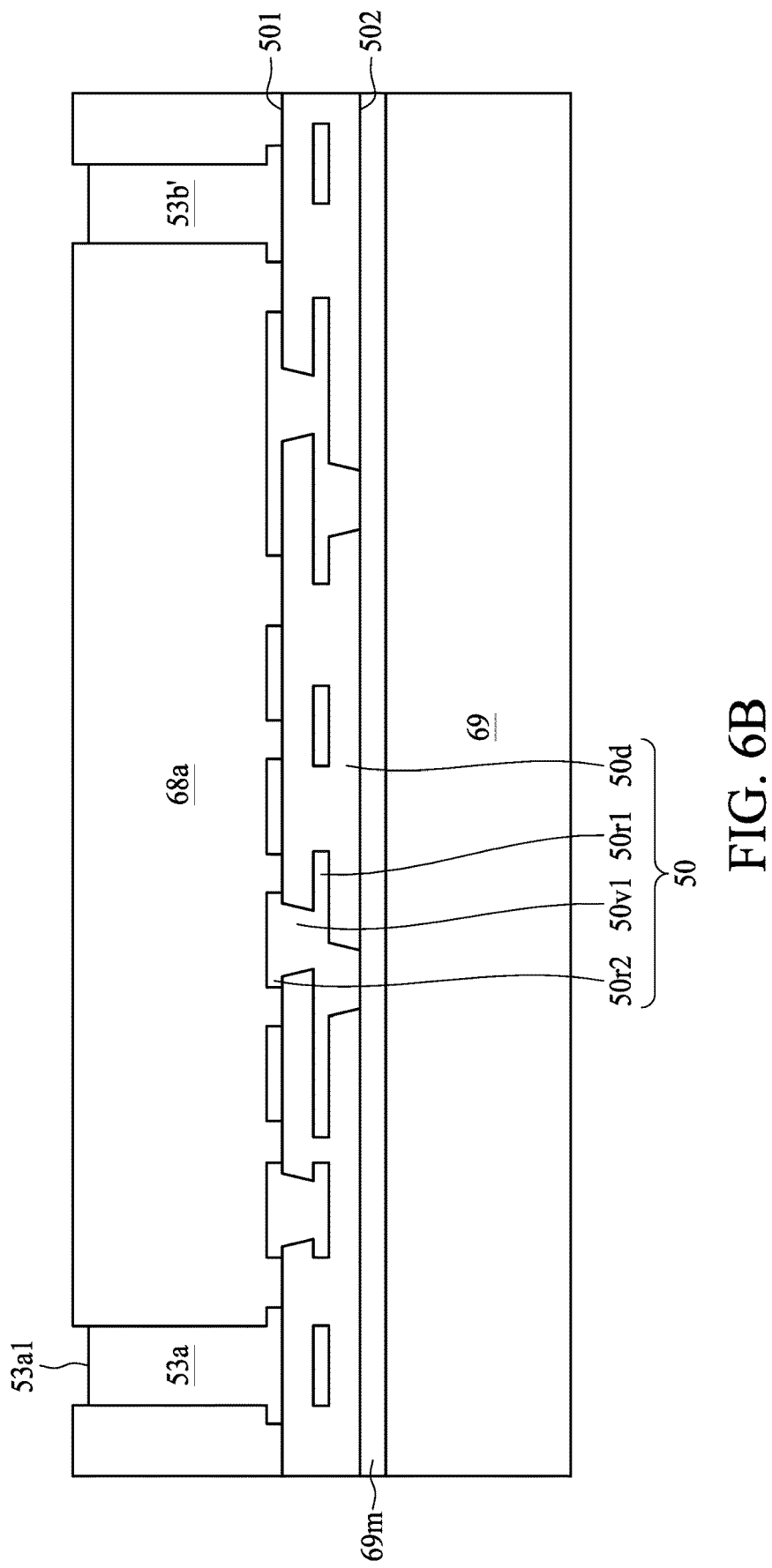

Referring FIG. 6B, a photoresist or mask 68a is disposed on the top surface 501 of the circuit layer 50. The photoresist 68a defines a plurality of openings that expose a portion of the conductive layer 50r2. The conductive elements 53a and 53b' are formed within the openings by, for example, electroplating or other suitable processes. In some embodiments, the conductive element 53b' is a first portion of the conductive element 53b shown in FIG. 5.

Referring to FIG. 6C, a photoresist or mask 68b is disposed on the photoresist 68a. The photoresist 68b defines an opening that exposes the conductive layer 53b' formed in FIG. 6B. The conductive element 53b" is formed within the openings by, for example, electroplating or other suitable processes. In some embodiments, the conductive element 53b" is a second portion of the conductive element 53b shown in FIG. 5. The conductive element 53b' and the conductive element 53b" are connected to form the conductive element 53b.

Figure 6D:
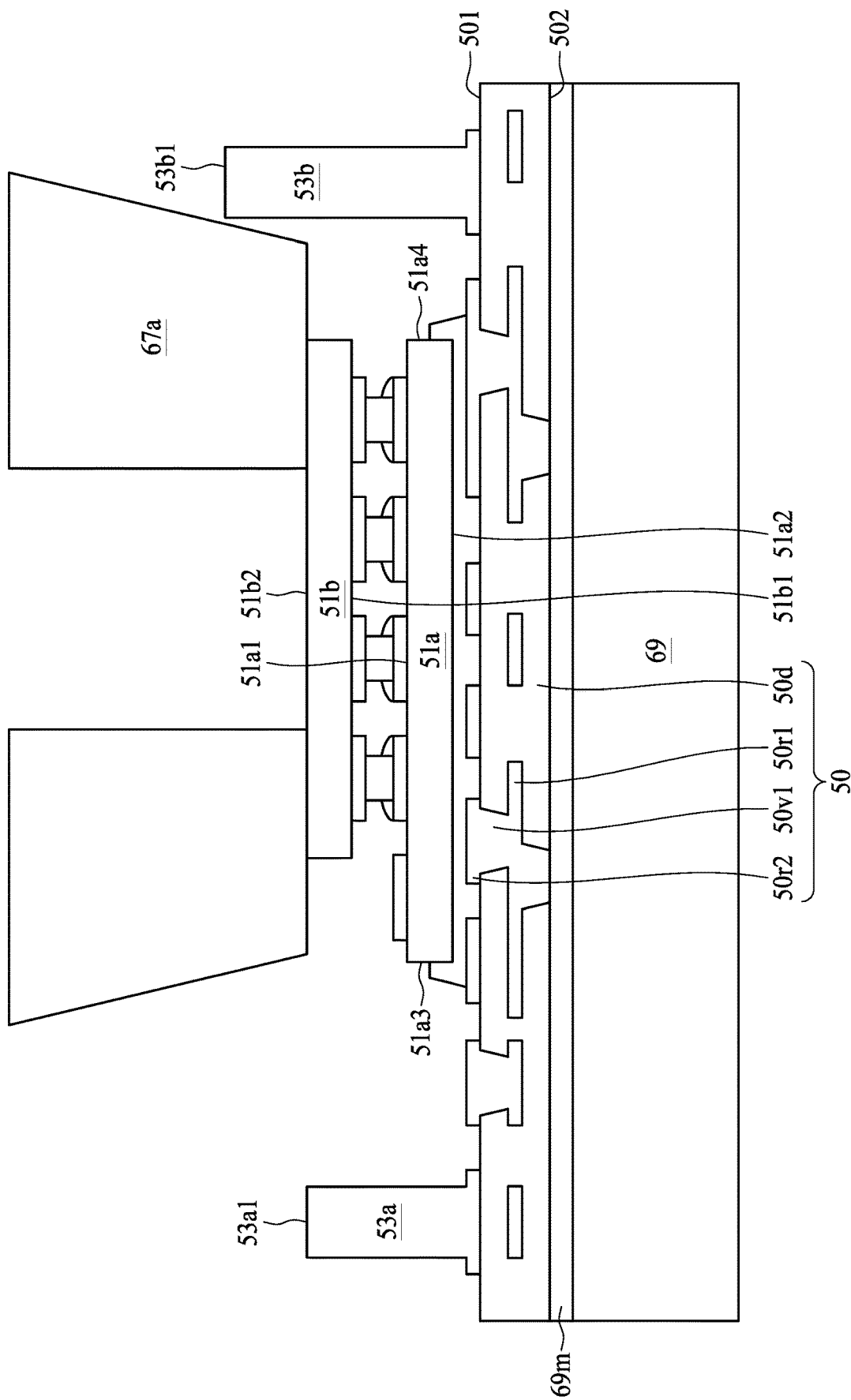

Referring to FIG. 6D, the photoresists 68a and 68b are removed, and the electronic component 51a is placed on the top surface 501 of the circuit layer 50. The electronic component 51a has an active surface 51a1 and a back surface 51a2 facing toward the top surface 501 of the circuit layer 10. In some embodiments, the electronic component 51a is placed on the top surface 501 of the circuit layer 50 by using a vacuum nozzle 67a.

The electronic component 51b is placed on the electronic component 51a. The electronic component 51b has an active surface 51b1 facing toward the active surface 51a1 of the electronic component 51a and a back surface 51b2. In some embodiments, the electronic component 51b is placed on the electronic component 51a by using the vacuum nozzle 67a.

Figure 6E:
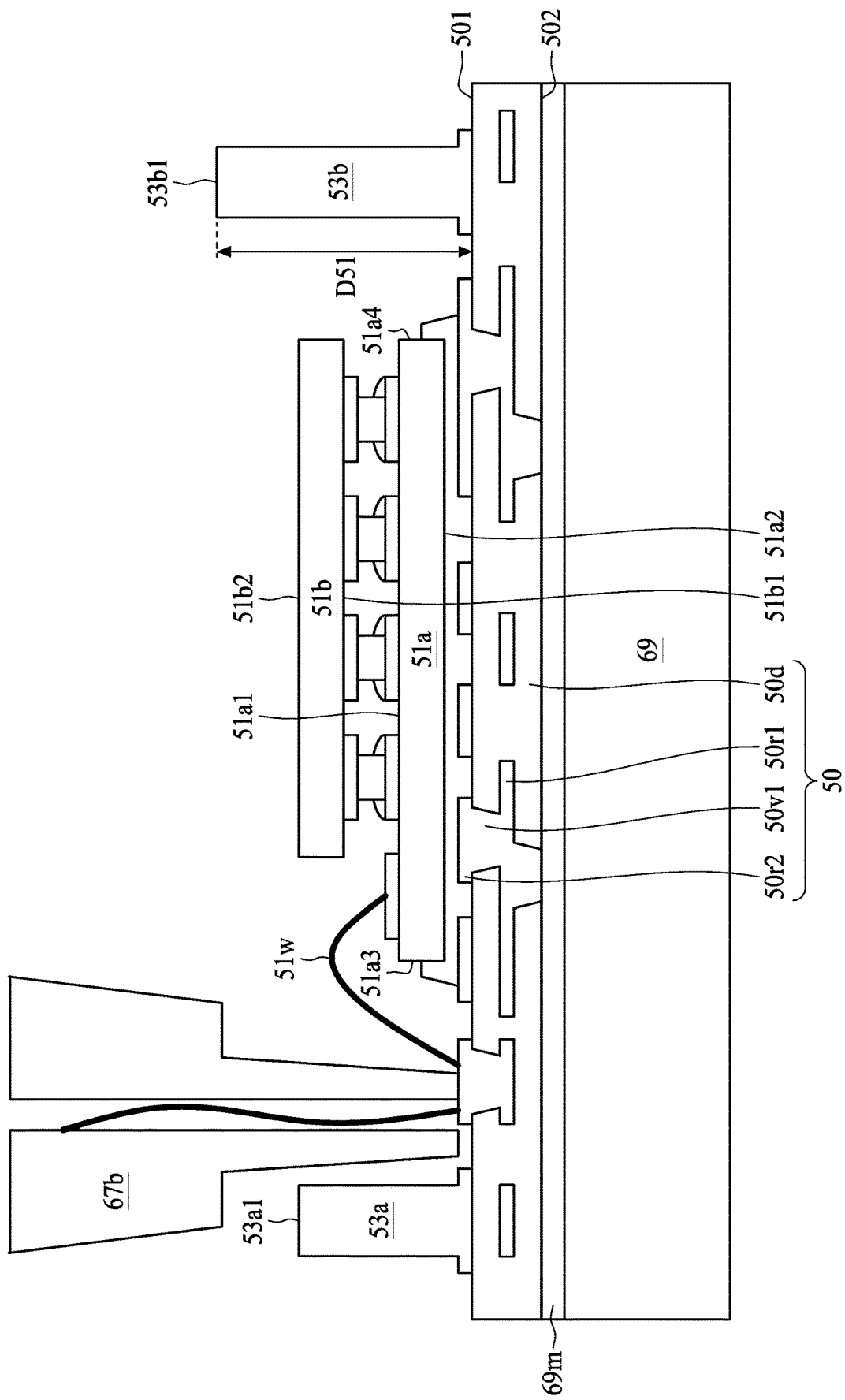

Referring to FIG. 6E, a bonding wire 51w is formed or disposed to electrically connect a portion of the conductive contacts on the active surface 51a1 of the electronic component 51a to the conductive layer 50r2 of the circuit layer 50. In some embodiments, the bonding wire 51w is formed by a bonding machine 67b. As described above, the height D52 of the conductive element 53a is less than the height D51 of the conductive element 53b and the distance D54 between the electronic component 51a and the conductive element 53a is greater than the distance D53 between the electronic component 51a and the conductive element 53b. This can help to prevent a collision between the bonding machine 67b and the conductive element 53a or the electronic component 51a.

In other embodiments, as shown in FIG. 6E', the electronic component 51b' is placed on the electronic component 51a. The operations shown in FIG. 6E' are similar to those shown in FIG. 6D and FIG. 6E, except that in FIG. 6E', the back surface 51b1 of the electronic component 51b' faces toward the active surface 51a1 of the electronic component 51a. In some embodiments, the electronic component 51b' is placed on the electronic component 51a by using a vacuum nozzle. A bonding wire 51w is then formed or disposed to electrically connect a portion of the conductive contacts on the active surface 51a1 of the electronic component 51a to the conductive layer 50r2 of the circuit layer 50.

Figure 6F:
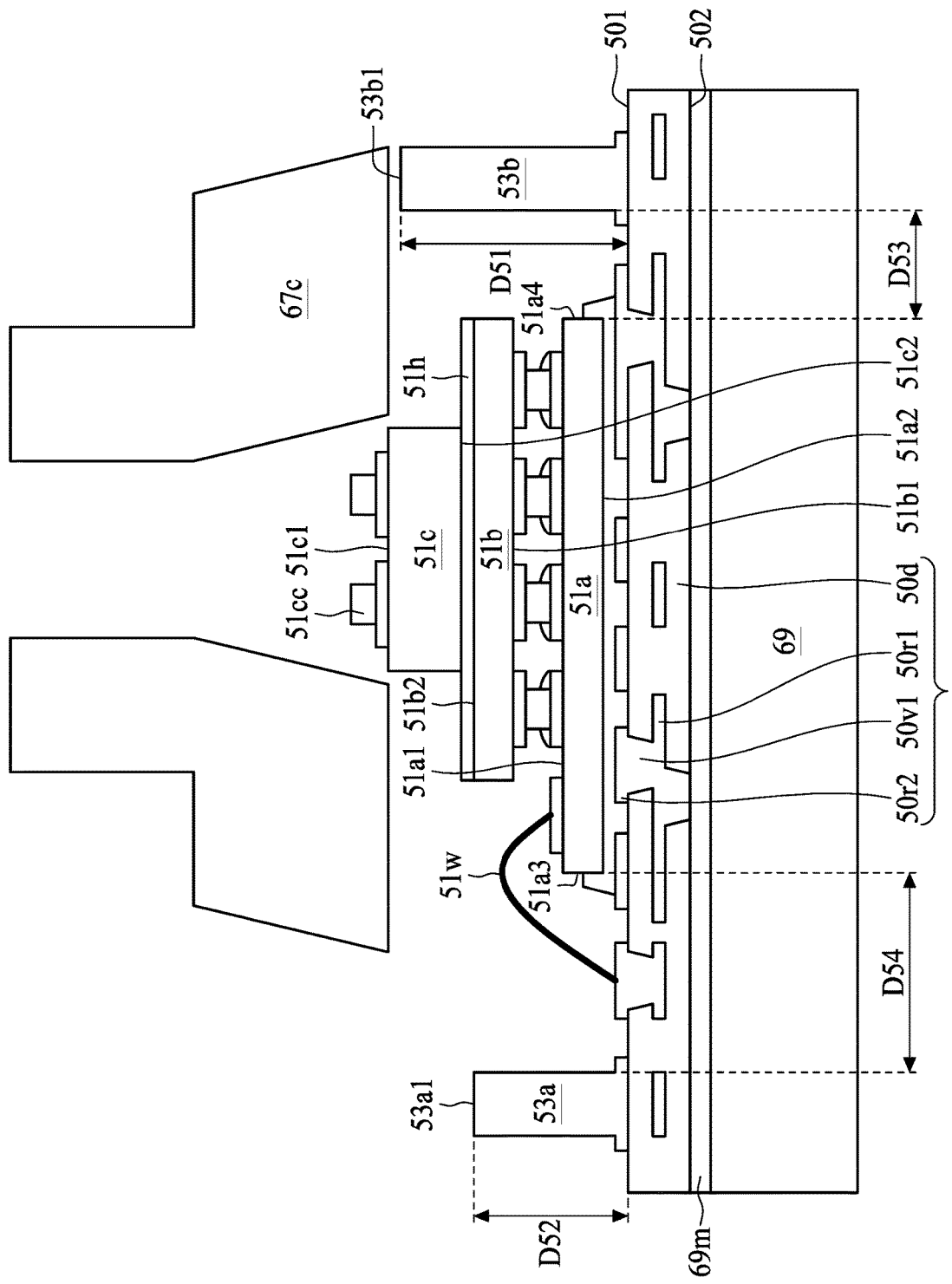
FIG. 6F, FIG. 6G, FIG. 6H and FIG. 6I illustrate a method of manufacturing a semiconductor package device in accordance with some embodiments of the present disclosure.

Referring to FIG. 6F, the electronic component 51c is placed on the electronic component 51b. The electronic component 51c has an active surface 51c1 and a back surface 51c2 facing toward the back surface 51b2 of the electronic component 51b. In some embodiments, the electronic component 51c is placed on the electronic component 51b by using a vacuum nozzle 67c.

Figure 6G:
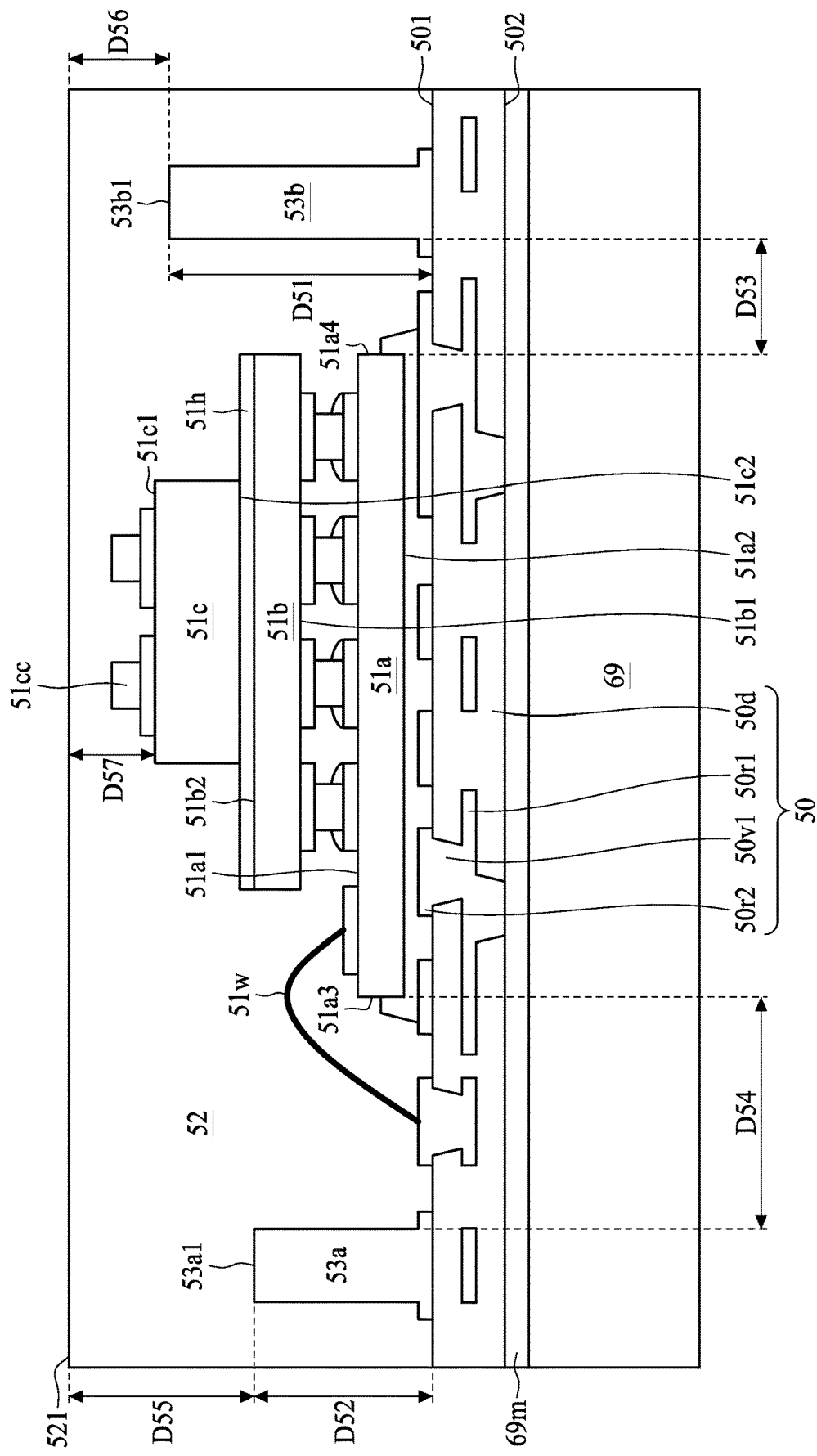

Referring to FIG. 6G, the package body 52 is formed on the top surface 501 of the circuit layer 50 to cover the electronic components 51a, 51b, 51c and the conductive elements 53a, 53b. In some embodiments, the package body 52 includes, for example, organic materials (e.g., a molding compound, a BT, a PI, a PBO, a solder resist, an ABF, a PP or an epoxy-based material), inorganic materials (e.g., a silicon, a glass, a ceramic or a quartz), liquid and/or dry-film materials or a combination thereof. The package body 52 may be formed by a molding technique, such as transfer molding or compression molding.

Figure 6H:
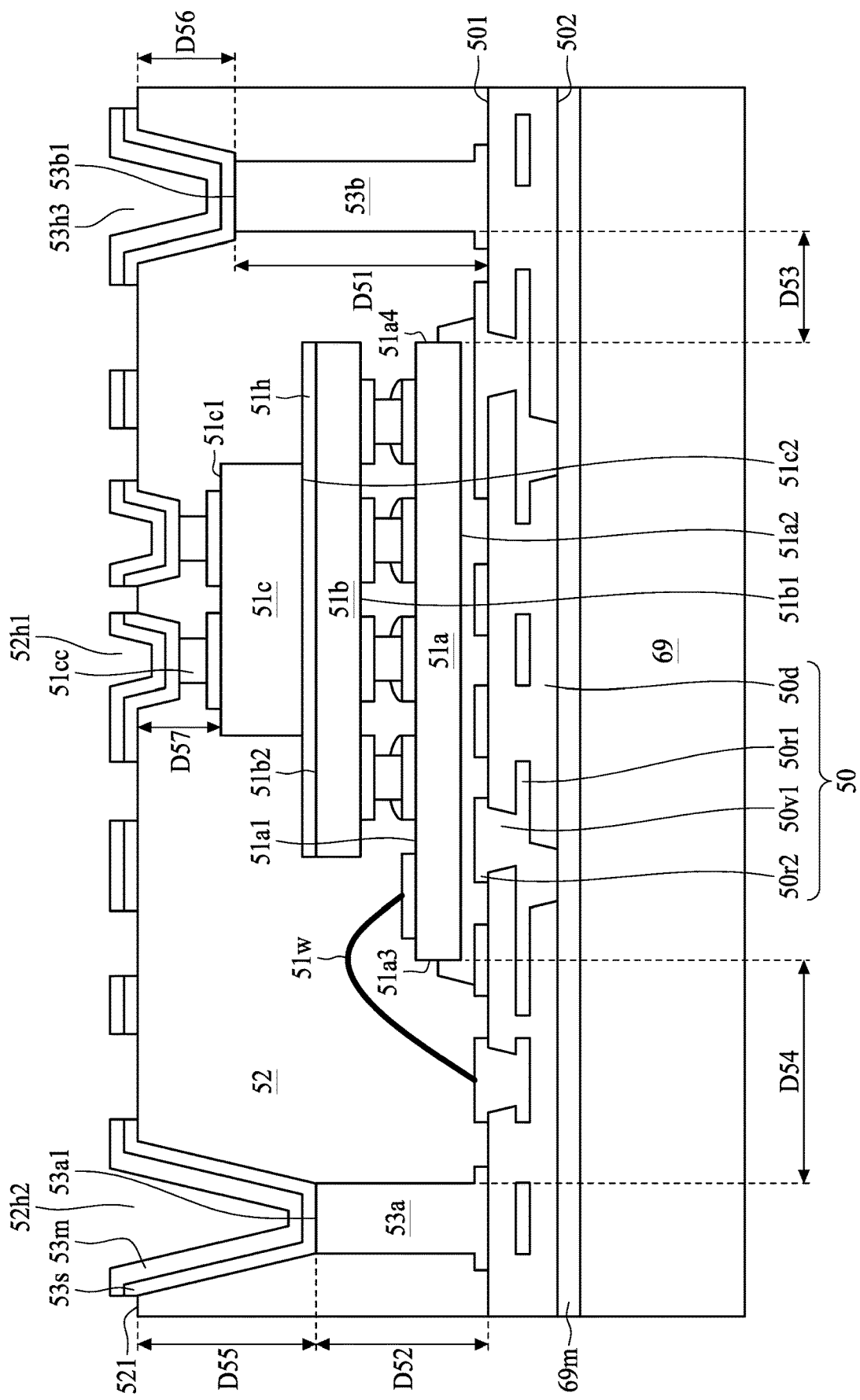

Referring to FIG. 6H, a plurality of openings 52h1, 52h2 and 52h3 are formed in the package body 52 to expose the electrical contact 51cc on the active surface 51c1 of the electronic component 51c, the top surface 53a1 of the conductive element 53a and the top surface 53b1 of the conductive element 53b. In some embodiments, the openings can be formed by laser drilling, etching or other suitable processes.

The seed layer 53s is formed on the top surface 521 of the package body 52 and extends within the openings 52h1, 52h2, 52h3. The conductive layer 53m is then formed on the seed layer 53s. For example, the conductive layer 53m is formed over the top surface 521 of the package body 52 and extends within the openings 52h1, 52h2, 52h3. In some embodiments, the seed layer 53s and the conductive layer 53m may be formed by the following operations: (i) forming a seed layer on the top surface 521 of the package body 52 and extending within the openings 52h1, 52h2, 52h3 by using CVD or PVD; (ii) placing a photoresist or mask on the seed layer; (iii) defining a predetermined pattern on the photoresist or mask by, for example, lithographic technique; (iv) disposing or forming a conductive material on the seed layer to form the patterned conductive layer; (v) removing the photoresist or mask; and (vi) removing a portion of the seed layer that is not covered by the patterned conductive layer. In some embodiments, in the operation (iv), the conductive material can be formed on the seed layer by electroplating, electroless plating, sputtering, paste printing, bumping or bonding.

Figure 6I:
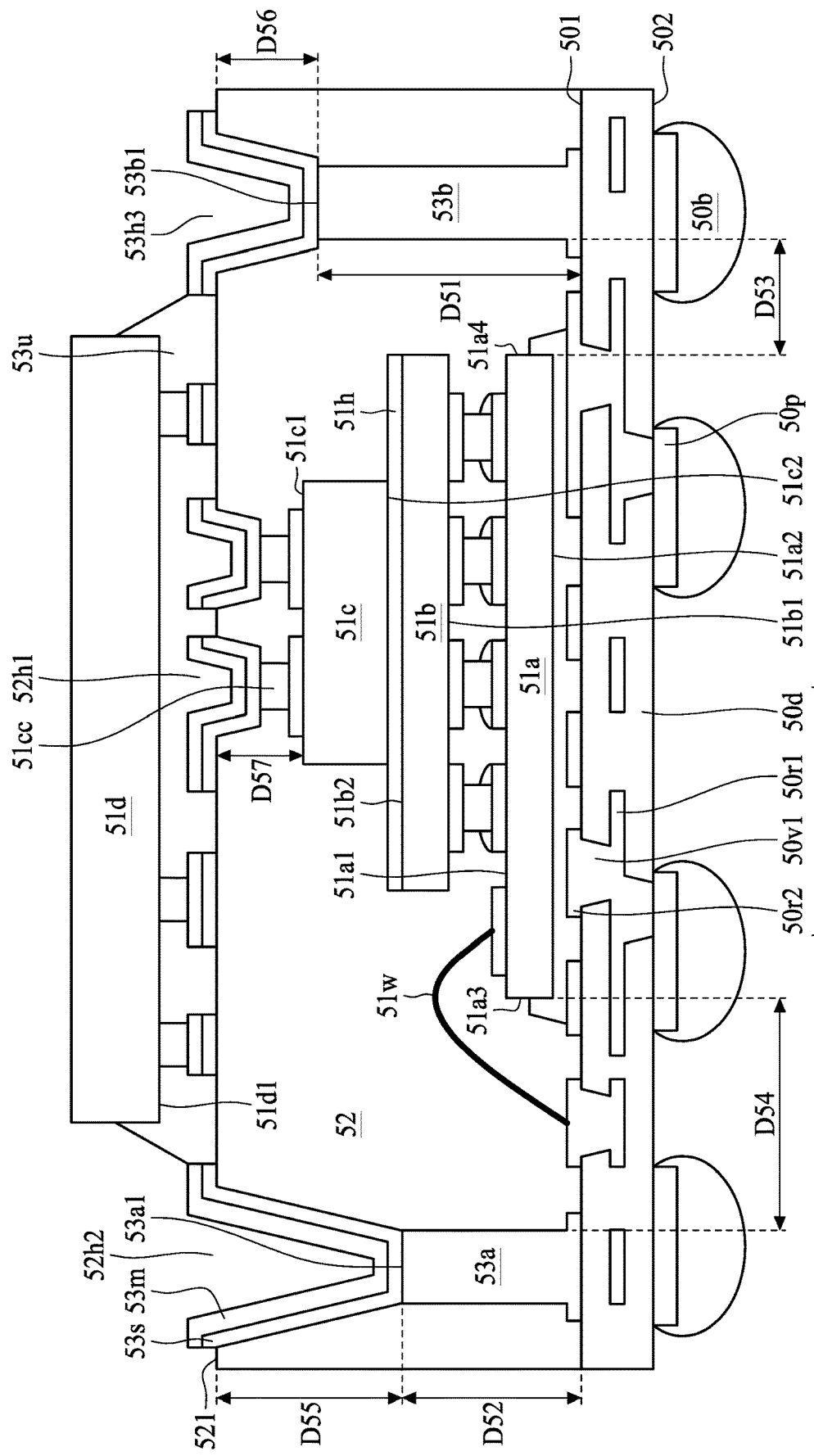

Referring to FIG. 6I, the electronic component 51d is placed on the conductive layer 53m on the top surface 521 of the package body 52 and electrically connected to the electronic component 51c and/or the conductive elements 53a, 53b through the conductive layer 53m. In some embodiments, the underfill 53u may be formed on the top surface 521 of the package body 52 to cover the active surface 51d1 of the electronic component 51d. In some embodiments, the underfill 53u includes an epoxy resin, a molding compound (e.g., an epoxy molding compound or other molding compound), a polyimide, a phenolic compound or material, a material including a silicone dispersed therein, or a combination thereof.

The carrier 69 is removed and a portion of the metal layer 69m is removed to form the conductive pads 50p of the conductive layer 50. In some embodiments, the portion of the metal layer 69m can be removed by etching or other suitable processes. The electrical contacts 50b are then formed on the conductive pads 50p to form the semiconductor package device 5 as shown in FIG. 5. In some embodiments, the electrical contacts 50b include a C4 bump, a BGA or an LGA. In some embodiments, in the electrical contacts 50b can be formed by electroplating, electroless plating, sputtering, paste printing, bumping or bonding.

As used herein, the terms "approximately," "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a circuit layer having a top surface;
   a first electronic component disposed on the top surface of the circuit layer, the first electronic component having an active surface, a back surface facing the top surface of the circuit layer and a lateral surface extending from the active surface to the back surface;
   a first conductive element disposed on the top surface of the circuit layer, the first conductive element having a top surface and a lateral surface; and
   a package body encapsulating the active surface and the lateral surface of the first electronic component and the lateral surface of the first conductive element, wherein the package body defines a recess that exposes the top surface of the first conductive element;
   a conductive layer disposed on the package body, wherein the conductive layer extends to the recess of the package body and is electrically connected to the first conductive element;
   a second electronic component disposed on the package body and electrically connected to the first electronic component through the conductive layer;
   wherein a distance between the active surface of the first electronic component and the top surface of the circuit layer is greater than a distance between the top surface of the first conductive element and the top surface of the circuit layer.

2. The semiconductor package device of claim 1, further comprising:
   a seed layer disposed within the recess and electrically connected to the top surface of the first conductive element.

3. The semiconductor package device of claim 1, wherein a distance between the active surface of the first electronic component and the top surface of the first conductive element is less than 220 µm.

4. The semiconductor package device of claim 1, further comprising:
   a third electronic component disposed between the first electronic component and the circuit layer, wherein the third electronic component has an active surface facing the top surface of the circuit layer and a back surface facing the back surface of the first electronic component.

5. The semiconductor package device of claim 4, wherein a distance from the third electronic component to the first conductive element is in a range from 1.89 micrometer (µm) to 1432.2 µm.

6. The semiconductor package device of claim 4, further comprising:
   a bonding wire electrically connecting the second electronic component to the circuit layer; and
   a second conductive element adjacent to the bonding wire,
   wherein the first conductive element is further away from the bonding wire than is the second conductive element, and
   wherein a height of the first conductive element is greater than a height of the second conductive element.

7. The semiconductor package device of claim 6, wherein a distance between the second electronic component and the second conductive element is greater than a distance between the second electronic component and the first conductive element.

8. The semiconductor package device of claim 4, wherein the package body encapsulates the active surface of the third electronic component.

9. The semiconductor package device of claim 4, wherein a portion of the back surface of the third electronic component is exposed from the first electronic component, and the portion of the back surface of the third electronic component is encapsulated by the package body.

10. A method of manufacturing a semiconductor package device, comprising:
provniding a circuit layer;
forming a first conductive element extending from the circuit layer and a first portion of a second conductive element extending from the circuit layer;
forming a second portion of the second conductive element on the first portion of the second conductive element;
disposing a first electronic component on the circuit layer and between the first conductive element and the second conductive element after forming the first conductive element and the second portion of the second conductive element;
bonding a conductive wire to electrically connect the first electronic component to a conductive pad on the circuit layer, wherein the conductive pad is disposed between the first electronic component and the first conductive element;
disposing a second electronic component on the first electronic component, wherein the second electronic component has an active surface and a back surface facing the first electronic component, and a distance between the active surface and the circuit layer is greater than a height of the first conductive element and is greater than a height of the second conductive element;
forming a package body to encapsulate the first electronic component, the second electronic component, the first conductive element and the second conductive element;
removing a portion of the package body to expose the active surface of the second electronic component, a top surface of the first conductive element and a top surface of the second portion of the second conductive element;
forming a conductive layer on the active surface of the second electronic component, the top surface of the first conductive element and the top surface of the second portion of the second conductive element; and
disposing a third electronic component on the conductive layer.

* * * * *